United States Patent
Brown et al.

(10) Patent No.: US 10,461,216 B2
(45) Date of Patent: Oct. 29, 2019

(54) GALLIUM NITRIDE CROSS-GAP LIGHT EMITTERS BASED ON UNIPOLAR-DOPED TUNNELING STRUCTURES

(71) Applicants: Elliott R. Brown, Beavercreek, OH (US); Weidong Zhang, Cary, NC (US); Tyler Growden, Dublin, OH (US); Paul R. Berger, Columbus, OH (US); David Storm, Washington, DC (US); David Meyer, Washington, DC (US)

(72) Inventors: Elliott R. Brown, Beavercreek, OH (US); Weidong Zhang, Cary, NC (US); Tyler Growden, Dublin, OH (US); Paul R. Berger, Columbus, OH (US); David Storm, Washington, DC (US); David Meyer, Washington, DC (US)

(73) Assignee: Wright State University, Dayton, OH (US)

( * ) Notice: Subject to any disclaimer, the term of this patent is extended or adjusted under 35 U.S.C. 154(b) by 35 days.

(21) Appl. No.: 15/714,749

(22) Filed: Sep. 25, 2017

(65) Prior Publication Data
US 2019/0027644 A1  Jan. 24, 2019

Related U.S. Application Data

(60) Provisional application No. 62/398,950, filed on Sep. 23, 2016.

(51) Int. Cl.
*H01L 33/06* (2010.01)
*H01L 29/88* (2006.01)
(Continued)

(52) U.S. Cl.
CPC .............. *H01L 33/06* (2013.01); *C02F 1/325* (2013.01); *H01L 29/2003* (2013.01); *H01L 29/882* (2013.01); *H01L 33/007* (2013.01); *H01L 33/12* (2013.01); *H01L 33/32* (2013.01); *H01S 5/0213* (2013.01); *H01S 5/0425* (2013.01); *H01S 5/141* (2013.01); *H01S 5/187* (2013.01);
(Continued)

(58) Field of Classification Search
CPC ....... H01L 33/06; H01L 33/50; H01L 29/882; H01L 33/32; H01L 33/12; H01L 33/007; H01L 29/2003; H01S 2304/02; H01S 2304/04; H01S 5/0425; H01S 5/34333; H01S 5/18369; H01S 5/0213; H01S 5/187; H01S 5/141; C02F 2303/04; C02F 2201/3228; C02F 2201/3222; C02F 1/325
See application file for complete search history.

(56) References Cited

U.S. PATENT DOCUMENTS

| | | | |
|---|---|---|---|
| 7,875,958 B2 * | 1/2011 | Cheng | B82Y 10/00 257/190 |
| 2007/0280319 A1 * | 12/2007 | Sekiguchi | B82Y 20/00 372/45.01 |
| 2017/0009944 A1 * | 1/2017 | Wheatley | F21K 9/64 |

* cited by examiner

*Primary Examiner* — Xinning(Tom) Niu
(74) *Attorney, Agent, or Firm* — McNees Wallace & Nurick LLC

(57) ABSTRACT

Gallium nitride based devices and, more particularly to the generation of holes in gallium nitride based devices lacking p-type doping, and their use in light emitting diodes and lasers, both edge emitting and vertical emitting. By tailoring the intrinsic design, a wide range of wavelengths can be emitted from near-infrared to mid ultraviolet, depending upon the design of the adjacent cross-gap recombination zone. The innovation also provides for novel circuits and unique applications, particularly for water sterilization.

19 Claims, 18 Drawing Sheets

(51) Int. Cl.
  *H01L 33/32* (2010.01)
  *H01S 5/343* (2006.01)
  *H01S 5/14* (2006.01)
  *H01S 5/187* (2006.01)
  *H01S 5/02* (2006.01)
  *H01S 5/042* (2006.01)
  *H01S 5/183* (2006.01)
  *H01L 33/00* (2010.01)
  *H01L 33/12* (2010.01)
  *C02F 1/32* (2006.01)
  *H01L 29/20* (2006.01)
  *H01L 33/50* (2010.01)

(52) U.S. Cl.
  CPC ...... *H01S 5/18369* (2013.01); *H01S 5/34333* (2013.01); *C02F 2201/3222* (2013.01); *C02F 2201/3228* (2013.01); *C02F 2303/04* (2013.01); *H01L 33/50* (2013.01); *H01S 2304/02* (2013.01); *H01S 2304/04* (2013.01)

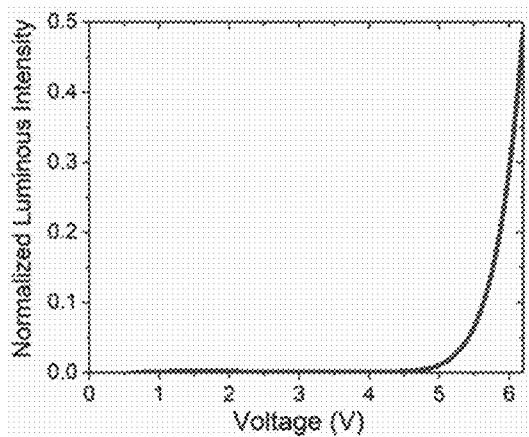
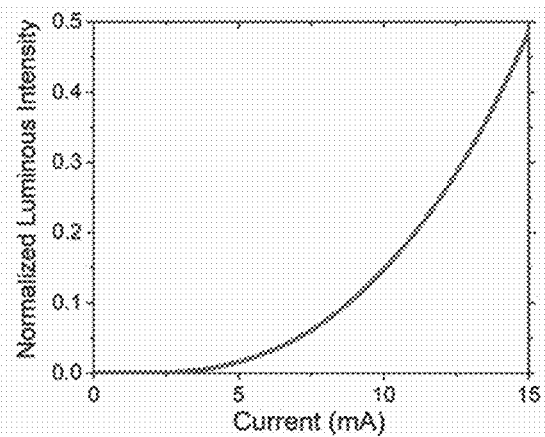
FIG. 6A          FIG. 6B
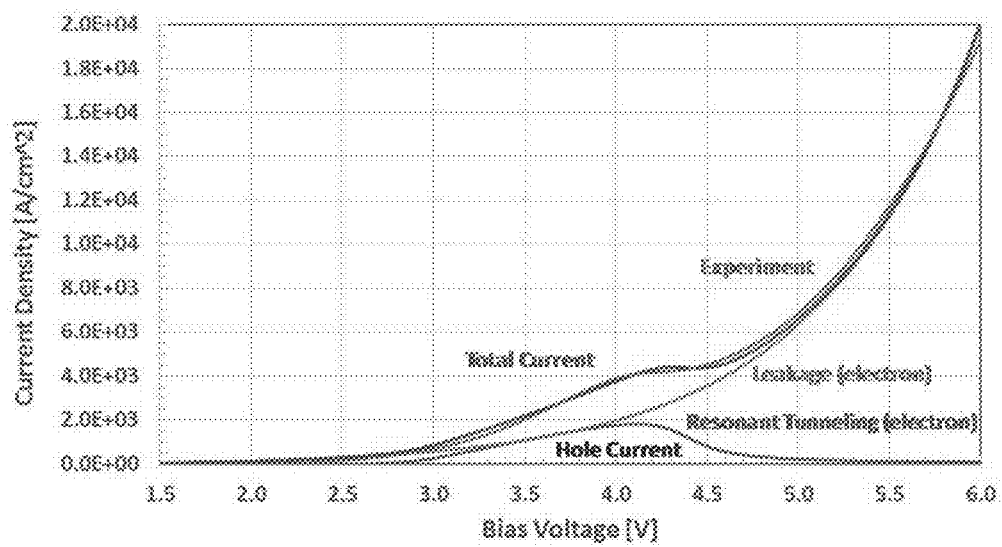
FIG. 7

GALLIUM NITRIDE CROSS-GAP LIGHT EMITTERS BASED ON UNIPOLAR-DOPED TUNNELING STRUCTURES

CROSS-REFERENCE TO RELATED APPLICATIONS

This application claims the benefit of U.S. Provisional Patent Application Ser. No. 62/398,950 entitled "Gallium Nitride Cross-Gap Light Emitters Based on Unipolar-Doped Tunneling Structures" filed on Sep. 23, 2016, the entirety of which is incorporated by reference herein.

ORIGIN OF THE INVENTION

This invention was made with government support under N00014-11-1-0721 and N00014-16-12686 awarded by the Office of Naval Research. The government has certain rights in the invention.

The present application has Government rights assigned to the Office of Naval Research under the "III-N Devices and Architectures for Terahertz Electronics" MURI program (N00014-11-1-0721) and its extension (N00014-16-1-2686).

TECHNICAL FIELD

The present innovation relates generally to gallium nitride based devices and, more particularly to the generation of holes in gallium nitride based devices lacking p-type doping, and their use in light emitting diodes and lasers, both edge emitting and vertical emitting. By tailoring the intrinsic design, a wide range of wavelengths can be emitted from near-infrared to mid ultraviolet, depending upon the design of the adjacent cross-gap recombination zone. The innovation also provides for novel circuits and unique applications, particularly for water sterilization.

BACKGROUND

Since the announcement of the first strong GaN blue-color, light-emitting diodes (LEDs), the interest in GaN photonics and electronics has grown steadily, and the commercial applications have expanded to the extent that GaN devices now comprise a viable industry. The key step forward was the development of a high-quality p-type GaN epitaxial layer using Mg as a dopant and an AlN buffer layer on a sapphire substrate. While the n-type dopant Si in GaN manifests as a shallow donor (~15 meV), p-type dopants, such as Mg in GaN, manifest as much deeper acceptors (~160 meV). The sapphire substrate was used instead of a GaN substrate because high-quality GaN substrates were not available at that time. Nevertheless, it allowed the growth of a traditional p-n (homo) junction LED having qualities similar to those demonstrated in GaAs since the 1960s. An exemplary conduction-valence band-bending plot is shown in FIG. 1(a). The LED emission wavelength and external quantum efficiency (QE) were around 430 nm (violet: 380-450 nm) and 0.2%, respectively, the latter being much higher than the QEs reported for previous blue-emitting LEDs based on SiC and ZnSe LEDs. However, the peak wavelength was considerably longer than the expected cross bandgap ($U_G$=3.4 eV) wavelength of 360 nm. This indicated that the recombination was via impurity states, likely associated with the p-type Mg dopant.

Soon thereafter GaN-based quantum-well LEDs were demonstrated using InGaN for the quantum well. Although the external QE was only 0.15% and the emission wavelength was still in the violet at 415 nm, this was considered a major step forward since the use of a quantum well allows for tuning of the emission wavelength through control of the In fraction and the well width. GaN/InGaN quantum well LEDs were demonstrated ranging in peak emission wavelength from blue around 450 nm (range=450-495 nm) to red at 675 nm (range=620-740 nm). In addition, for the blue emitters an external QE of 20% was achieved.

The GaN/InGaN LED development segued quickly into the GaN laser diode (LD), demonstrated first in 1996. The gain medium consisted of multiple InGaN quantum wells and the lasing wavelength was near 404 nm (violet). However, the laser cavity consisted of the traditional in-plane double-cleaved-facet structure, so the emission occurred in the same plane as the quantum wells, not the more desirable vertical direction. So researchers pursued the vertical cavity, surface emitting laser (VCSEL) diode. However, the same issue that plagued GaN LEDs from the beginning—the high resistivity of the p-doped GaN (e.g., Mg dopants)—again became a problem. This is because LDs of all types generally run at higher electrical current levels than LEDs since more current is required across the p-n junction to generate the electron-hole population inversion necessary for lasing action. The resistive p-doped layer not only causes a significant voltage drop and Joule heating, but it also creates a non-uniformity in the electric potential which is deleterious to the laser efficiency. This is in addition to the fact that the p-type GaN is generally difficult to grow, requiring extra materials (e.g., magnesium dopant) and processing (e.g., high-temperature rapid thermal annealing to activate), which also adds cost and reduces the yield in fabricating both LEDs and LDs alike.

The p-doping challenge has led researchers to unusual methods to mitigate the p-doping issues. To achieve population inversion and uniform light output across a LED to mitigate current crowding, the electrical pump current needs to be uniformly spread over the p-GaN contact area, starting from ohmic contacts located outside the optical cavity defined by the DBR mirrors. The high resistivity of the p-GaN region becomes a bottleneck for uniform carrier spreading. To overcome this problem, a thin highly conductive ITO layer was introduced to reduce the resistance. However, the ITO layer adds additional difficulties in deposition and fabrication, and can contribute non-negligible loss to the optical cavity, which leads to higher threshold current.

Independent of the detail design, all conventional p-n-junction GaN-based light emitters suffer from a phenomenon called current "droop". This occurs in devices designed for intense light emission, whereby the emission strength and internal quantum efficiency fall with increasing current density above a certain level. The physical reason is the poor mobility and high resistivity of the holes in p-doped GaN. This causes the p-doped regions to heat up with increasing current density, which in turn increases the resistivity further and causes a significant fraction of the bias voltage to drop across the p-type region.

SUMMARY OF THE INVENTION

The following presents a simplified summary of the innovation in order to provide a basic understanding of some aspects of the innovation. This summary is not an extensive overview of the innovation. It is not intended to identify key/critical elements of the innovation or to delineate the scope of the innovation. Its sole purpose is to present some concepts of the innovation in a simplified form as a prelude to the more detailed description that is presented later.

According to an aspect, the innovation provides viable hole generation for radiative cross-gap recombination with electrically injected electrons. This eliminates the need for a p-n junction altogether and provides for efficient hole generation by interband (Zener) tunneling of electrons. The radiative recombination with electrons can take place either in a quantum well if there are two or more barriers, or in the accumulation regions for electrons and holes on the emitter side of the structure (recombination zone).

According to an aspect, the innovation comprises a valence-to-conduction interband electron tunneling diode, comprising: a substrate; an n-type bottom contact; a radiative recombination zone that could be a single layer, a single quantum well or a series of multi-quantum wells; a bottom spacer; an electron barrier, either single or multiple barrier; an interband-tunneling hole generator which creates a large concentration of holes on the emitter side; a top spacer separating the tunneling region from the ohmic contact; and an n-doped top contact layer.

In one embodiment, the structures according to the innovation can generate a high conduction-band electron current density through design of the heterobarriers and doping profiles. They can also generate a high density of holes. Without being bound by theory, the generation of high density holes may be principally by Zener tunneling of electrons, but possibly also by impact ionization of valence-band states in the presence of energetic conduction-band electrons. Because the electron and hole currents and densities are created by fundamentally different physical mechanisms, they can in principle be balanced. This is an important consideration for efficient operation of any light emitter, be it an LED or LD. The balance between the two mechanisms depends on the detailed GaN/InGaN/AlGaN/AlN heterostructure and doping profile. This is a first in GaN device technology.

In one example embodiment of the innovation, resonant-tunneling conduction-band electron current densities of order $1 \times 10^4$ A/cm$^2$, and Zener tunneling densities of order $10^2$ A/cm$^2$ have already been achieved in the baseline device (See FIGS. 2, 9 and 10). In one embodiment, the electron current density could be decreased to match the Zener tunneling (or impact ionization) density, thereby enabling a much more efficient LED or LD. In another embodiment, a device according to the innovation could increase the Zener tunneling current to match the electron conduction-band current, but this is more challenging. If the Zener tunneling were to increase significantly, say by one order-of-magnitude, the structure according to the innovation could be used as a hole generator in conjunction with other device structures requiring holes in certain regions but electrons in others. This would allow for the elimination of a p-type contact, which is a difficult task in III-nitrides.

According to an aspect, the innovation provides a solid-state device comprising a bottom n-type layer; a top n-type layer; a middle layer inserted between the top layer and bottom layer. The middle layer may include at least two materials provided between the top and bottom layers which serve as heterojunction tunnel barriers. The top layer and the middle layer form an interband tunnel barrier to generate holes by Zener tunneling across the potential barrier of the forbidden energy gap, and where the middle layer forms at least one intraband tunnel barrier to control electron flow.

In one embodiment, the innovation includes a device wherein the top, middle and bottom layers are comprised of gallium nitride, aluminum nitride, indium nitride or alloys and combinations of III-nitride semiconductors or III-nitride compatible semiconductors. In one embodiment, the heterojunction interband tunnel barrier is formed by the polarization effects at III-nitride heterojunctions.

According to an aspect, the innovation provides a light emitting diode comprising a bottom n-type layer; a top n-type layer; a middle layer inserted between the top layer and the bottom layer. The middle layer may comprise at least two materials provided between the top and bottom layers which serve as heterojunction tunnel barriers. In one embodiment, the top, middle and bottom layers are independently selected from gallium nitride, aluminum nitride, indium nitride or alloys and combinations of III-nitride semiconductors or III-nitride compatible semiconductors.

The middle layer form an interband tunnel barrier to generate holes by Zener tunneling across the potential barrier of the forbidden energy gap, and where the middle layer forms a least one intraband tunnel barrier to control electron flow. The radiative recombination of Zener injected holes from the top layer occurs directly with electrons electrically injected from the bottom layer.

In one embodiment, p-type doping is not part of the active device.

According to an aspect, the innovation provides a laser diode comprising a bottom n-type layer; a top n-type layer; a middle layer inserted between the top layer and bottom layer, where the middle layer comprises at least two materials provided between the top and bottom layers which serve as heterojunction tunnel barriers. The top layer and the middle layer form an interband tunnel barrier to generate holes by Zener tunneling across the potential barrier of the forbidden energy gap. In addition, the middle layers form at least one intraband tunnel barrier to control electron flow and wherein the radiative recombination of Zener injected holes from the top layer occurs directly with electrons electrically injected from the bottom layer. A Fabry-Perot etalon is added external to the radiative recombination zone to form a laser diode

BRIEF DESCRIPTION OF THE DRAWINGS

FIG. 1. (a) Conduction- and valence-band-bending diagram for homojunction GaN-based p-n+ LED showing photon emission by GaN-cross-gap recombination on the p-side of the junction. (b) Double-heterojunction, quantum-well laser showing photon emission between 2D quantized states in the InGaN quantum well, and therefore at photon energy below the GaN bandgap. (c) Prior art MQW LED with a p-n junction clearly shown under bias.

FIG. 2. (a) Epitaxial-layer "stack" for GaN-based, unipolar-doped RTD and LED structure. (b) Conduction-band bending diagram with zero bias applied between emitter and collector. Note: the bottom epitaxial layer of FIG. 3($a$) is the "emitter" of FIG. 3($b$).

FIG. 3. (a) Conduction- and valence-band bending in GaN/AlN RTD structure computed numerically with Silvaco Atlas at a bias voltage of 5.0 V. (b) Hole generation rate (per unit volume) for bulk GaN as a function of electric field, assuming a bandgap energy of 3.4 eV and a reduced effective mass of $m_r = 0.20 \, m_0$.

FIG. 5. (a) Photograph of GaN RTD structure showing the three DC-coupled electrodes, and the RTD mesa, easily identified through its emission of violet light. (b) Light spectral intensity curves vs bias voltage showing a dominant peak centered at ≈360 nm. The insert plot shows the emission spectrum under reverse bias. The measurements were made with a fiber grating spectrometer having a resolution of 2.0 nm.

FIGS. 6A and 6B are graphs depicting the light-vs-bias voltage (L-V) and light-vs-bias current (L-I) curves for the device of FIGS. 5A and 5B. (a) the light-vs-bias voltage (L-V) and (b) light-vs-bias current (L-I) curves.

FIG. 7 is a graph depicting the current-voltage curves for the GaN/AlN RTD structure of FIGS. 5A and 5B. The experimental curve is fit using a combination of resonant-tunneling and leakage-current models for the electrons, and a Zener tunneling model for the holes. The sum of the model currents is a good fit to experimental curve.

DETAILED DESCRIPTION

Figure 1A:
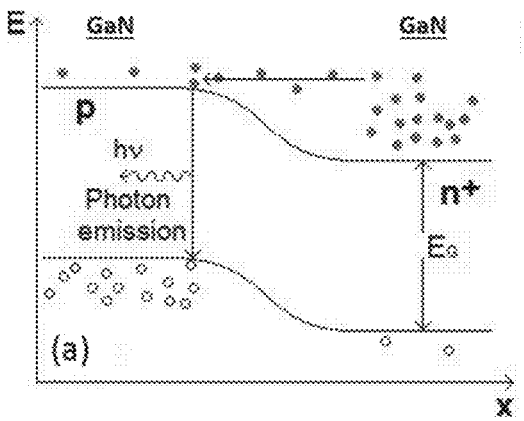
FIGS. 1(A)-1(C) depict various stages of development of GaN-based photonics and electronics.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

According to an aspect, the innovation provides an alternative approach to GaN-based light emitters that does not require p-type GaN or a p-n junction at all. In one embodiment, the innovation provides a device that is the unipolar-doped (n-type only) GaN resonant tunneling structure shown in FIG. 2(a). All the epitaxial layers are grown on semi-insulating or n-doped Ga-polar GaN, N-polar GaN, sapphire, SiC, AlN, or Si substrates by either radio frequency (RF) plasma assisted molecular beam epitaxy (MBE) or by metalorganic chemical vapor deposition (MOCVD). The polarization changes direction between Ga- and N-polar GaN, which allows for the entire device structure to be flipped. This allows for greater control over where the recombination zone will be located, and therefore where the light will be emitted. In one embodiment, the GaN substrate has a smooth surface morphology and low defect concentration. It is understood that the epitaxial layers of the "active region", numbered 10-50 in FIG. 2(*a*) could be reversed in order with little or no effect on the device performance.

According to the innovation, the first epitaxial layer is doped heavily n$^{++}$-type (>1×10$^{19}$ cm$^{-3}$) with silicon to serve as the bottom ohmic contact layer after the isolation of individual devices. The next five epitaxial layers above the n$^+$ are unintentionally doped (UID), but have a finite critical thickness larger than the n$^{++}$ region for which it becomes energetically favorable to produce dislocations to reduce local strain caused by lattice mismatch of the epilayers as referenced to the substrate. The mismatched layers used here are well below that critical thickness, which is the thickness at which defects spontaneously occur. The thicknesses shown in FIG. 2(*a*) are specific to the design that has already been demonstrated as a resonant-tunneling diode (RTD) having stable negative differential resistance (NDR), and as a unipolar-doped LED (see below). The NDR is made possible by electron tunneling through the double-barrier "heterostructure": two AlN barriers, each nominally 2.0 nm thick, separated by a GaN quantum well, nominally 3.0 nm thick. Other thicknesses may work for LED or LD emission as well.

Epitaxial Growth

In one embodiment of the innovation, the growth technique of the GaN unipolar-doped LEDs is RF-plasma assisted molecular beam epitaxy (MBE) on freestanding, Ga-polar (0001) GaN substrates. Suitable GaN substrates may be grown by hydride vapor phase epitaxy (HVPE). A high-quality HVPE GaN substrate wafer is estimated to have a density of threading dislocations between 10$^6$ and 10$^7$ cm$^{-2}$. The Ga-polar (0001) surface of the wafer is finished with a chemical-mechanical polish (CMP). Prior to epitaxial growth, the HVPE GaN wafer should be prepared in the ultra-high vacuum (UHV) MBE system using a wet chemical clean. In one embodiment, after loading into the MBE system the substrate may be out-gassed under UHV conditions for 30 minutes at 600° C. After cooling to room temperature, the substrate may be transferred to the deposition chamber for growth.

In one embodiment, the deposition chamber may be equipped with dual-filament effusion cells for evaporation of elemental aluminum and gallium; a single-filament effusion cell for evaporation of elemental silicon, used as an n-type dopant; and an RF plasma source for delivery of nitrogen. The substrate temperature may be measured by a thermocouple mounted behind the substrate and is maintained at a constant temperature in the range of about 700° C. to about 900° C. throughout the growth. In one embodiment, the temperature is maintained at approximately 860° C.

In one embodiment, the plasma may be operated at a constant power of roughly 300 W with N$_2$ gas flow of roughly 0.9 standard cubic centimeters per minute (sccm). The gallium and aluminum fluxes can be chosen to create nitrogen-limited growth conditions with no accumulation of excess metal and a growth rate of approximately 3 nm/min. The silicon effusion cell conditions can be adjusted to result in a silicon concentration of approximately 5×10$^{19}$ cm$^{-3}$ in the GaN buffer (lower contact) and 8×10$^{19}$ cm$^{-3}$ in the upper GaN contact layer.

In one embodiment, growth may be initiated with a 2-min exposure of the substrate surface to the N plasma, followed by simultaneous opening of the Ga and Si shutters. All layers should be grown continuously and without interrupts. Growth should be terminated by the closing of all shutters, extinguishing the N plasma, and cooling the sample to room temperature while in the MBE system Device Physics The doping concentration is an important design feature for the device physics. In one embodiment, the plasma-assisted MBE growth allows for very high concentrations of n-type doping (e.g., up to ≈10$^{20}$ cm$^{-3}$). This allows for a heavy accumulation of free electrons on the emitter side of the barriers (see bottom side in FIG. 2(*a*)) when the device is under forward bias (positive voltage on the top contact). The high electron concentration promotes high electron tunneling current density. The high n-type doping also enables ohmic contacts on the top and bottom of the structure having very low contact resistance. This makes the device more efficient as a light emitter and a negative-resistance oscillator, and reduces contact-induced heating too.

According to another aspect, the innovation provides band bending, i.e., the variation of the conduction- and valence-band electron potential energies with location in space, and under bias voltage. The zero-bias band bending diagram is shown in FIG. 2(*b*). This is non-trivial in GaN because of two important effects: (1) electric polarization, and (2) piezoelectricity. These effects normally do not significantly affect more common semiconductor-heterostructure materials such as GaAs/AlAs or InGaAs/AlGaAs. The difference is that GaN, AlN, and Al$_x$Ga$_{1-x}$N alloys thereof, are all highly non-centrosymmetric (hexagonal Wurtzite crystal structure) with a strong built-in dipole moment per unit cell. Because the dipole moment is different in GaN and AlN, there is a discontinuity in the electric polarization P at the interfaces between the two materials, which from classical electrostatics creates a bound sheet-charge.

A piezoelectric effect occurs because of the strain induced in the thin AlN barriers by the tendency for thin crystalline layers to match their lateral lattice constants to that of the crystalline material in which they are embedded (commonly called "pseudomorphic" matching in the literature). For thin AlN barriers embedded in GaN, this means that the basal lattice constant of AlN, a=0.311 nm at 300 K, matches to the basal lattice constant of GaN, a=0.319 nm at 300 K. In other words, the AlN must expand laterally by ≈2.5% which creates elastic tension and a resultant perpendicular electric field because of its large cross-coupled piezoelectric coefficient (piezoelectric stress coefficient e$_{31}$=−0.60 Cb/m$^2$). The result of both the polarization and piezoelectric effects is a huge discontinuity in the electric field (i.e., −dφ/dx where φ is the electron potential energy plotted in FIG. 2(*b*)) at the interfaces. Such a strong discontinuity that the electric field changes sign from positive to negative, or vice versa, at all four of the GaN/AlN interfaces is remarkable.

Given the abrupt discontinuities shown in FIG. 2(*b*), something interesting happens in the band bending: the electric field at the last GaN/AlN interface relative to the emitter side [left-most interface of FIG. 2(*b*)] has approximately the same magnitude and sign as at the right-most GaN/AlN interface. In other words, the strong polarization and piezoelectric effects cancel out because of the even number (four) of heterointerfaces. Therefore, in an embodiment in which the field on the emitter side is designed to be very large, then the field on the collector side of the barriers will be equally large. As shown in FIG. 2(*b*), the emitter field is very large because of the UID layer separating the barriers from the Si-doped n$^{++}$ doped region. Electrons from the n$^{++}$ region diffuse into the UID region, creating an "accumulation" region with rapidly varying slope. This occurs even with zero bias applied to the device. The corresponding large field on the collector side is then maintained by the UID layer on that side (a "depletion" region), creating a very large drop in electron potential energy (~2.0 eV), even at zero bias.

This unusual band bending in the GaN/AlN RTD structure creates the capability for cross-gap light emission from electron-hole pairs with the holes created through valence-to-conduction interband (Zener) tunneling. The hole generation occurs at the point in the structure where the valence band electrons starts the interband tunneling process. To understand how interband tunneling can occur in such a wide-bandgap material, plotting of the bivalent band bending, conduction and valence bands together, as shown in FIG. 3(a), at a bias voltage [applied to the top contact of FIG. 2(a)] of +5.0 V. This band-bending diagram was computed using a numerical transport tool, Silvaco-Atlas, which accounts for all electrostatic, polarization, and piezoelectric effects, as well as drift-diffusion, semiclassical, and quantum-transport effects. The vertical axis is still electron potential energy as in FIG. 2(b), and the horizontal axis is the distance from the quasi-neutral point of the top $n^{++}$ region of the device structure of FIG. 2(a). The valence band-edge in the GaN at the collector edge of the double-barrier structure is only about 10 nm separated from the conduction band edge in the GaN at the left end of the UID region on the collector side. This is because of the very large electric field across this region. And it means that there may be a significant probability of interband tunneling of electrons from the valence band to the conduction band, as depicted symbolically with the red horizontal arrow in FIG. 3(a). This is known historically as Zener tunneling and has been observed in many different semiconductors including Si. Thus, holes are generated inside the LED/laser, instead of injected from the outside resistive contacts and bulk layers.

Figure 3A:
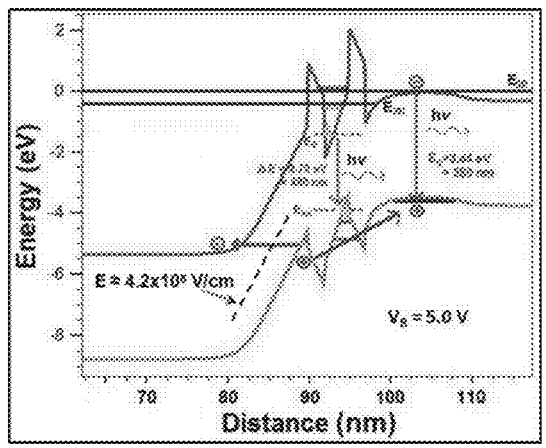
FIGS. 3A and 3B are graphs depicting the results of interband-tunneling analyses.
Figure 3B:
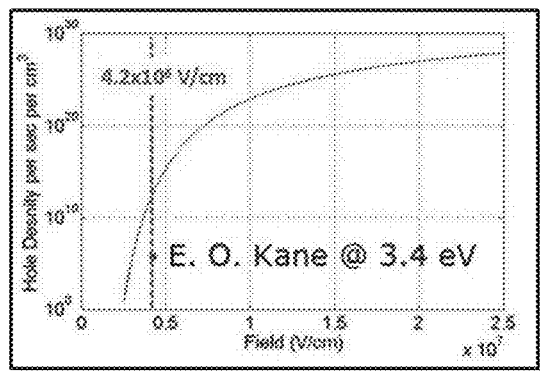

The interband-tunneling hole generation rate using the venerable model of E.O. Kane was also computed. The result, plotted in FIG. 3(b), shows the very rapid rise of hole-generation rate with field. From the slope in the depletion layer of FIG. 3(a), the electric field was estimated to be $E \approx U_G/8$ nm=(3.4 eV)/(8 nm)→$4.2 \times 10^6$ V/cm—a huge field by semiconductor standards but still less than the accepted breakdown field in GaN of $5 \times 10^6$ V/cm. This value of E field is superimposed on the Kane curve in FIG. 3(b), showing that the hole generation rate is $\approx 10^{13}$/cm$^3$-s. FIG. 3(a) shows where these holes are created, in the GaN adjacent to the AlN barrier on the collector side. Without being bound by theory, it is hypothesized that these holes then tunnel through to the GaN electron-accumulation layer on the emitter side, as shown graphically in FIG. 3(a). Once on the emitter side, they can recombine radiatively with electrons because of the direct bandgap of GaN. This two-step tunneling process is aided by the fact that the holes created on the collector side by the first (Zener tunneling) step have virtually no electrons to recombine with in this same region. They primary means of relaxing in (kinetic) energy is to tunnel through the two AlN valence-band barriers to the emitter side, where there is a high density of electrons for joint radiative recombination.

This hole generation and tunneling enables another, more specific radiative recombination depicted graphically in FIG. 3(a) inside the quantum well. In the process of holes tunneling through the barriers from the collector side toward the emitter side, they could possibly dwell at one of the quantum-confined hole levels in the quantum well, such as the third hole level in FIG. 3(a). It is well known that resonant tunneling through upper levels in a double-barrier quantum well can populate the lower levels by energy relaxation via phonon emission. This includes the ground level, $E_{1h}$, shown in FIG. 3(a). The same is true of the majority carrier (electron) resonant tunneling through the quantum well of FIG. 3(a): electrons tunnel through an upper level ($2^{nd}$ level) but by so doing, can populate the ground state $E_{1e}$ too. Given simultaneous populations of electrons in $E_{1e}$ and holes in $E_{1h}$, cross-gap radiative recombination is possible between the quantum-confined states.

Quantum-well cross-gap recombination is well known in GaAs, InGaAs, and GaN materials too. Significantly, according to the present innovation, the electric field across the GaN quantum well is enormous compared to these other materials because of the very high doping, and the polarization and piezoelectric effects. This introduces a very large Stark (red) shift in the emitted photon $hv_p$ compared to what it would be at zero bias. This is called the quantum-confined Stark effect (QCSE). The electron wavefunction becomes concentrated in the collector side of the quantum well, and the hole wavefunction in the emitter side, and the Stark-shifted photon energy is roughly.

$$hv_p = U_G + U_{1e} + U_{1h} - E \cdot w$$

Here, E is the electric field, assumed uniform across the quantum well, and w is the width of the well. Given $E_W \sim 4.2 \times 10^6$ V/cm, and w=2 nm ($2 \times 10^{-7}$ cm), $\Delta U$=0.84 eV. This is greater than $U_{1e} + U_{1h}$ in FIG. 3(a), so that under these conditions $hv_p$ is less than $U_G$ (i.e., $\lambda p > 370$ nm). Based on the ground levels shown in FIG. 3(a), $hv_p \approx 2.75$ eV ($\lambda_p \approx 450$ nm), which is in the violet region of the visible spectrum.

Experimental Demonstration

Figure 2A:
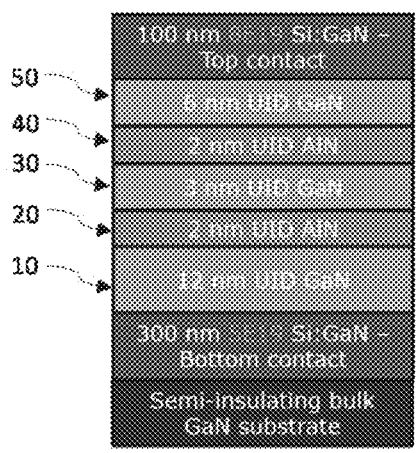
FIGS. 2A and 2B depict design features and analysis of band bending.
Figure 2B:
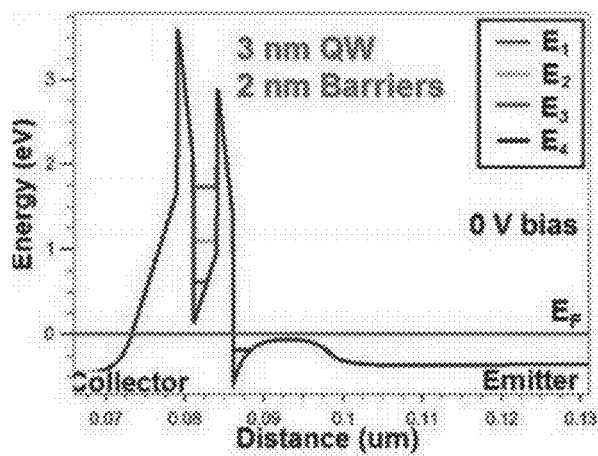
Figure 4A:
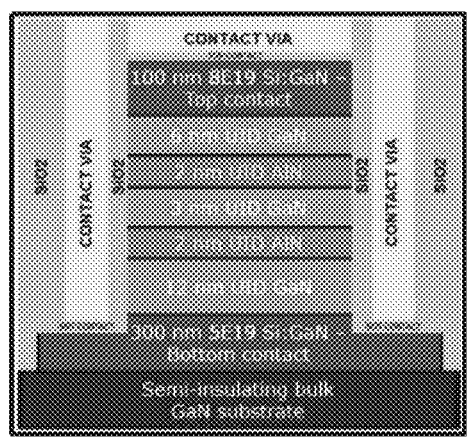
FIGS. 4A and 4B depicts design features and analysis of a resonant-tunneling diode according to the innovation. (a) Cross sectional view of GaN RTD structure showing the same "stack" as 3(a) but with the metallization, mesa isolation, and planarization aspects. (b) Current-density-vs-voltage curves for mesas in (a) ranging in area between 12 and 96 square microns.
Figure 4B:
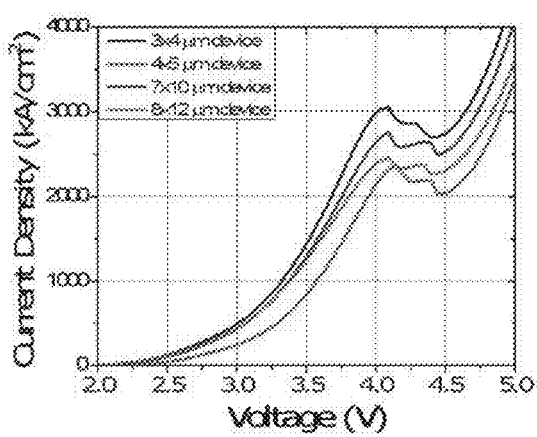

The first demonstration of the unipolar-doped, light emitting structure of FIG. 2(a) was purely electrical, testing for the tell-tale metric for RTDs—the negative differential resistance (NDR). First, RTDs were fabricated as shown in the cross section of FIG. 4(a). The metal contacts were fabricated directly on the top Si-doped $n^{++}$ layer of FIG. 2(a), and mesas were defined by dry etching using the top ohmic contact as an etch mask. Then the structures were isolated with $SiO_2$, and via holes were fabricated to allow ohmic contacts to the bottom $n^{++}$ layer. Shown in FIG. 4(b) are the resulting room-temperature current-density vs voltage (J-V) curves of RTD structures having different mesa area. The resulting J-V curves display an unmistakable NDR region with a peak voltage close to 4.0 V and a valley voltage around 4.5 V. Each of the J-V curves was highly repeatable, and although the peak-to-valley current ratio was not outstanding by common RTD standards, these results are the best that have ever been obtained in GaN-based RTDs in over a decade of investigation by researchers worldwide.

Figure 5A:
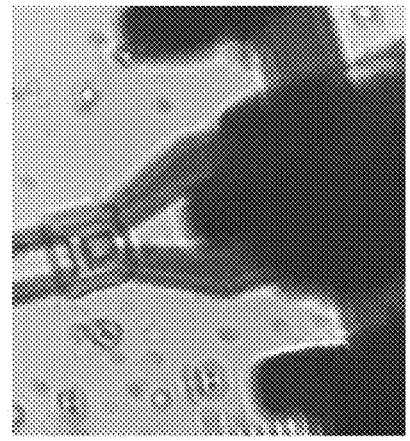
FIGS. 5A and 5B are a photograph and analysis of an RTD structure according to the innovation.
Figure 5B:
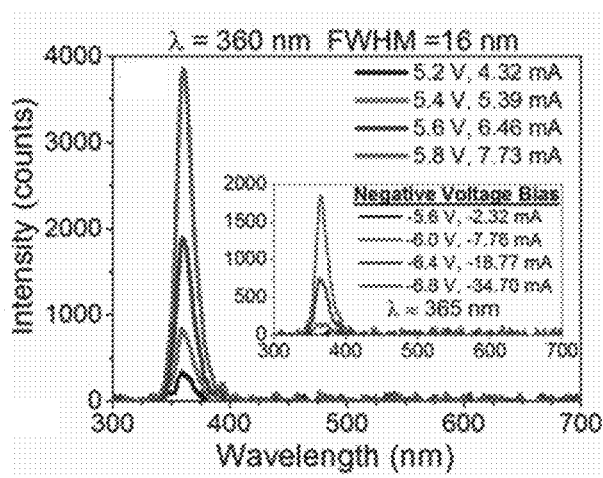

When the bias voltage was increased above ~4.5 V, a very interesting phenomenon occurred. The RTD mesa began emitting bright violet-colored light around its periphery as seen in the photograph of FIG. 5(a) [taken with a cellphone camera], which also shows the three electrodes (ground-signal-ground configuration) used to apply the electrical bias. The light emission was bright enough to be easily detected by a fiber-coupled grating spectrometer. The emission spectrum is shown in FIG. 5(b) with a dominant peak centered around 360 nm that increases in intensity with increasing bias current, and has a full-width at half maximum (FWHM) of 16 nm. 360 nm is, in fact, the wavelength corresponding to the 3.4 eV band-gap of GaN at room temperature. This supports the hypothesis that light emission is created by the recombination of electron-hole pairs in the electron accumulation region on the emitter side as shown schematically in FIG. 4(a) and explained above in the text.

The insert in FIG. 5(b) shows a similar emission spectrum under reverse bias although peaked at 365 instead of 360 nm. This further supports the hypothesis that the light emission is created by the recombination of electron-hole pairs across the GaN band-gap, but the emission spectrum does depend on asymmetry in the doping profile.

By measuring the peak intensity and normalizing to the background laboratory light, the light-vs-bias voltage (L-V) and light-vs-bias current (L-I) curves shown in FIGS. 6(a) and 6(b) were constructed, respectively. Both exhibit a threshold effect, the L-V curve at ≈4.5 V, and the L-I curve at ≈5.0 mA. Well above threshold, the L-I curve approaches the linear behavior expected for LEDs and LDs both. But as seen in the spectral emission curves of FIG. 5(b), the FWHM remains between 21 and 22 nm, even at the highest bias levels applied. This is considered too broad for a laser emission, so it was concluded that the device was operating as an LED, not an LD. Further evidence to support this is that there is no intentional optical cavity for this fabricated device structure of FIG. 4(a) necessary to support laser action. Although the metal contact to the top n++ layer could be acting as a mirror, there is no parallel mirror on the bottom of the structure directly below the top metal contact. Instead the metal contacts to the bottom layer are outside the area of the mesa and accessed through the via holes shown in FIGS. 4(a). Clearly, a re-design of the fabrication design and process flow, leveraging the intrinsic novel epilayer design, could be performed to add an appropriate external cavity.

Designing for Higher Quantum Efficiency in GaN LEDs

The present RTD/LED structure was designed for good RTD behavior, especially stable NDR at room temperature, not for efficient near-UV emission. Investigations were also conducted for simple ways of increasing the near-UV external quantum efficiency, even if deleterious to the RTD performance. The simplest so far is to bring the electron and hole current densities closer to equality by changing the device material parameters. To do this with confidence, analytic models of the electron and hole currents using standard formulations were developed. For the electrons, the inelastic form of the Breit-Wigner transmission probability was used through a single quasibound level in the presence of scattering, and integrate it over the Fermi-sea on the emitter side using the standard Tsu-Esaki integral of quantum transport theory. An electron "leakage" current term to represent a combination of: (1) inelastic tunneling at longitudinal energies well away from the quasibound level, and (2) thermionic emission over the top of the barriers was added. The leakage term has the form of the Shockley equation, $I_L = I_0[\exp(\alpha V/k_B T) - 1]$, where $I_0$ and $\alpha$ are constants determined by curve-fitting to the experimental data.

The hole current is associated with Zener (i.e., cross-gap) tunneling across the GaN bandgap in the depletion layer on the collector side of the AlN double-barriers. This mechanism is enabled by the huge electric field in this region created by the bias voltage along with the polarization- and piezoelectric-induced surface charge densities on all four GaN/AlN interfaces. A k-dot-p approach is used to evaluate the current density using a WKB approximation for the tunneling integral.

Figure 8:
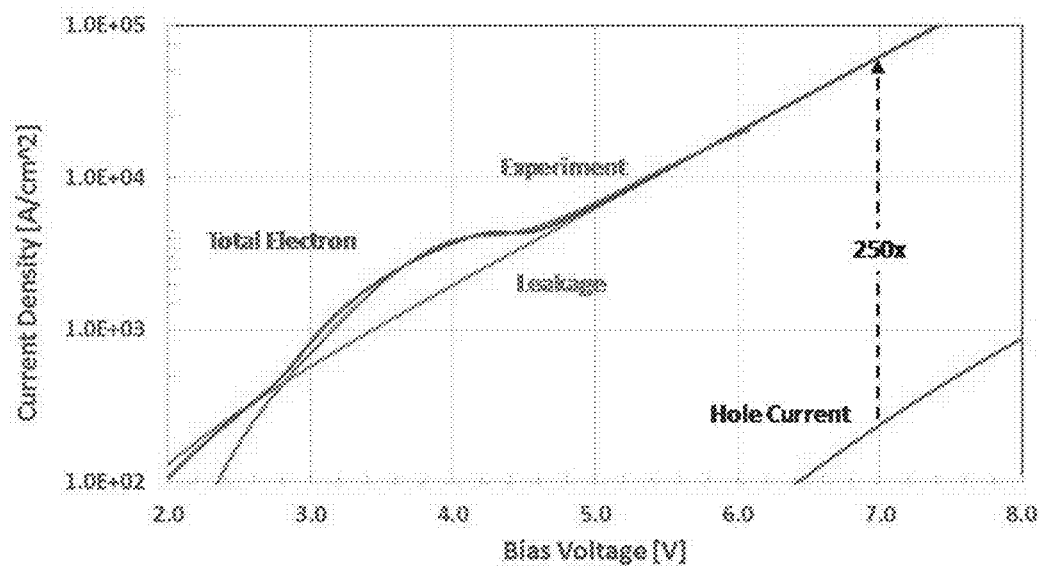
FIG. 8 is a graph depicting the same curves as FIG. 7 but plotted log-linear to see the relative magnitude of the electron and hole currents more clearly. The model electron current is 250× greater than the hole current at a bias of 7.0 V.

FIG. 7 compares the experimental J-V curve against the electron and hole current models for a bias voltage of 2.0-6.0 V, all plotted linear-linear. The combination of resonant-tunneling and leakage current of the electrons provides a good fit to the experimental J-V, the hole current being so much smaller in comparison that it essentially coincides with the abscissa in this plot. To ascertain the relative size of the hole current, FIG. 8 shows the experimental J on a $\log_e$-linear plot, an up to 8.0 V bias. Above ~5.0 V near where the device displays a threshold in near-UV light emission, the hole current density is below the electron current density (which is mostly leakage current) by ≈250 times, meaning at best the holes combine with $\frac{1}{250}^{th}$ of the available electrons, thus effectively capping the internal efficiency in this early prototype. Clearly, this poses an efficiency problem since it means that even if all holes recombined with electrons radiatively and all the emitted photons were collected without loss, the highest theoretical internal QE would be 0.004%.

Figure 9:
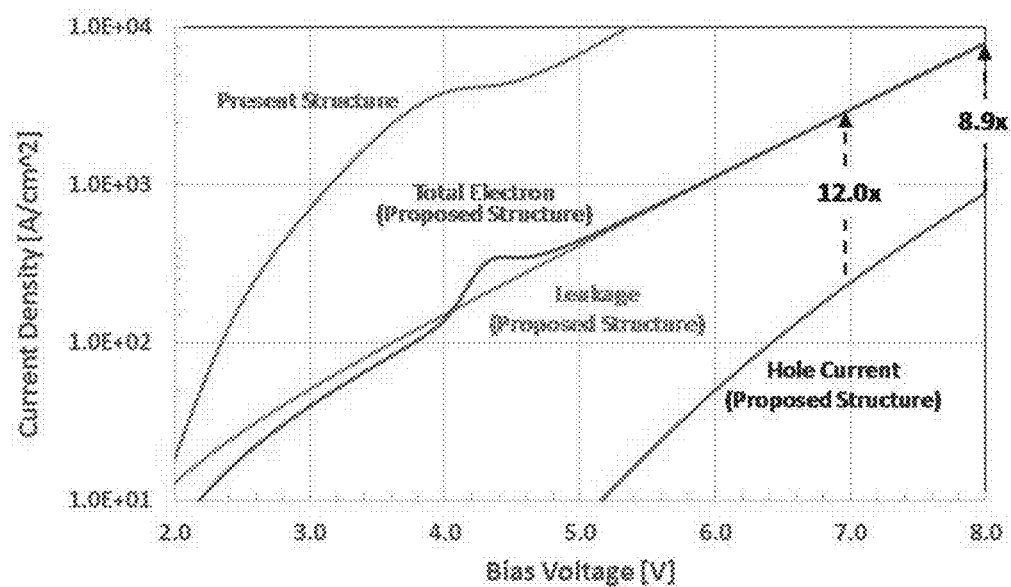
FIG. 9 is a graph depicting simulated current-voltage curves for a modified structure having lower n-type doping on the emitter side to reduce the electron current density to a level closer (within 12×) of the hole current density.

Consequently, Applicant's approach to increasing the internal QE is to shrink this difference. Further investigation of the models described above revealed that the simplest way to do this is to reduce the electron current density while holding the hole density nearly constant. A reduction in the Fermi energy ($E_F$) on the emitter side does exactly this, the electron resonant-tunneling and leakage mechanisms both falling monotonically, while the Zener-tunneling of holes having practically no dependence on $E_F$ on the emitter side at all. The n-type doping concentration outside the spacer layer on the emitter side determines $E_F$, and for the existing structure with $N_D = 5 \times 10^{19}$ cm$^{-3}$, $E_F = 0.25$ eV using the conduction-band parameter of GaN, m*=0.20 $m_e$. A reduction of $N_D$ to $5 \times 10^{18}$ would drop $E_F$ to 0.05 eV, and the resulting model J-V curves are plotted in FIG. 9. The electron current drops dramatically, but not the hole current, so that the difference between the two is just 12.0× at 7.0 V bias and 8.9× at 8.0 V bias. In other words, this relatively simple change in material growth parameter should improve the internal QE by at least 25×, all other material parameters assumed unchanged.

Device Designs

Examples of embodiments according to the innovation are provided in the drawings. Wherever possible, the same reference numbers will be used throughout the drawings to refer to the same or like parts. All embodiments are incumbent on a GaN/Al(Ga)N hole generator that eliminates the need for any p-type doping or p-type contacts.

Double Barrier RTD-LED Baseline Design (Platform)

According to an aspect, the innovation includes a new platform for solid state light emission. This new platform for solid state light emission that combines unipolar doping with bipolar tunneling for creating holes at, or immediately adjacent to, the zone of recombination with a generic nitride LED or laser has been designed, built and tested. Overcoming the obstacle of hole injection completely is a significant advancement proposed herein. And this embodiment can take on a myriad of permutations of design architectures.

Figure 10A:
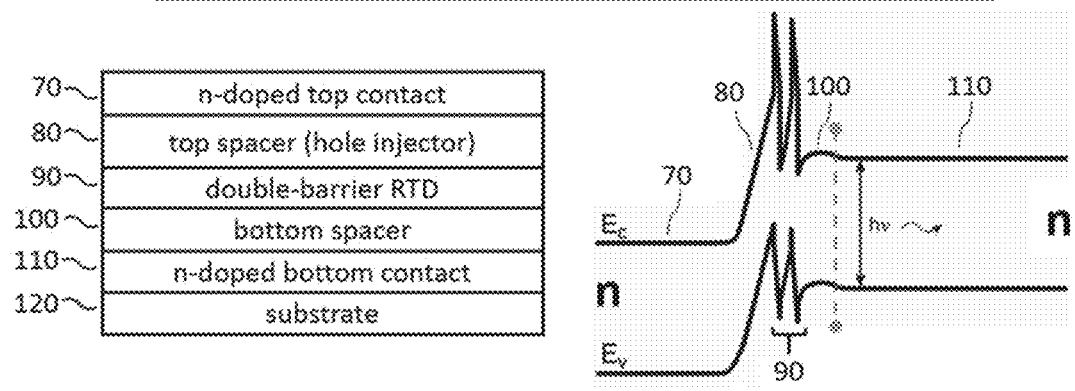
FIGS. 10A and 10B depict example embodiments of unipolar doped resonant tunneling light emitting diodes according to the innovation.
Figure 10B:
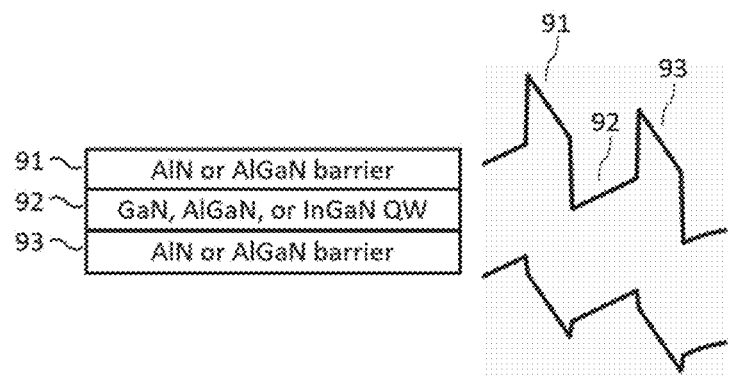

For the unipolar doping with hole injection to occur, there exists a range of layer thicknesses, layer doping levels, etc. that provides for enough band bending. For instance, FIG. 10(a) shows the proposed unipolar doped resonant tunneling light emitting diode that injects holes across layer 80 into a single emission zone, in or near layer 100. This design uses a double-barrier RTD injector. It will be appreciated that this could be replaced with a single barrier design. In this embodiment, there are acceptable ranges for multiple parameters across the structure—these ranges and parameters are listed in the Table I. Layer 90 in FIG. 10(a) is composed of several additional layers shown in the exploded view of FIG. 10(b). From FIG. 10(b), layers 91-93 have acceptable ranges for multiple parameters across the structure—these ranges and parameters are listed in Table I.

TABLE I

Material Characteristics

FIG. 10(a) - UDRT-LED top contact region n-type doping concentration: 5E16-2E20 cm$^{-3}$
top contact region thickness: 10-500 nm
top contact region composition: GaN, InGaN (1%-30% In), AlGaN (1%-90% Al)
UID top spacer thickness: 2-15 nm
UID top spacer composition: GaN, InN, InGaN (1%-99% In)
UID bottom spacer thickness: 1-50 nm
UID bottom spacer composition: GaN, InGaN (1%-100% In), AlGaN (1%-90% Al)
bottom contact region n-type doping concentration: 5E16-2E20 cm$^{-3}$
bottom contact region thickness: 10-1000 nm
bottom contact region composition: GaN, InGaN (1%-30% In), AlGaN (1%-90% Al)
substrate: GaN, Sapphire, AlN, SiC, Si FIG. 10(b) - Double barrier for 10(a)

Figure 11A:
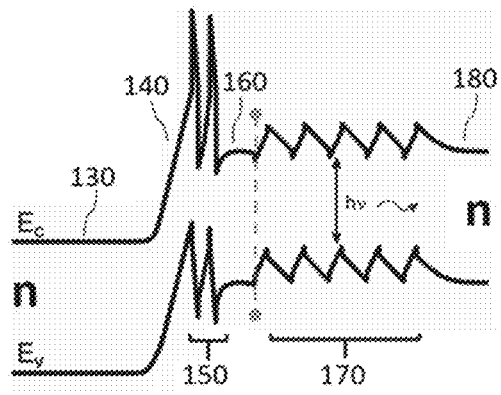
FIGS. 11A and 11B depict example embodiments of unipolar doped resonant tunneling light emitting diodes according to the innovation.

UID top barrier composition: AlN, AlGaN (40%-99% Al)
UID top barrier thickness: 0.5-5 nm
UID quantum well composition: GaN, InN, InGaN (1%-99% In), AlGaN (1%-70% Al)
UID quantum well thickness: 1-8 nm
UID bottom barrier composition: AlN, AlGaN (40%-99% Al)
UID bottom barrier thickness: 1-8 nm FIG. 11(a) shows another embodiment according to the innovation which is similar to FIG. 10(a) but has multiple quantum wells on the emitter side labelled as 170. This design is also scalable, meaning that modification of the recombination zone by adding multiple quantum wells (MQW) generally increases the radiative cross section for electron-hole recombination, and narrows its spectral width. This is particularly attractive for applications requiring a single narrow emission wavelength. A challenge with the MQW approach is lattice matching. The quantum wells will be mechanically strained so that only a limited number of them can be used before the strain exceeds the elastic limit, causing the material to "crack" at the microscopic level. This results in atomic dislocations and other defects in the material, which are generally deleterious to the operation of "bipolar" devices like the electron-hole light emitters. The number of quantum wells allowed depends inversely on the magnitude of strain, which depends in turn on the In or Al fraction in the $In_xGa_{1-x}N$ or $Al_xGa_{1-x}N$. Since the emission wavelength also increases with In fraction (through reduction in the bandgap), the number of quantum wells allowed scales inversely with the emission wavelength. So, more quantum wells will be allowed in a violet emitter than in a blue emitter, for example.

Additionally, as the number of QWs increases, so does the injection efficiency. This is because the carriers have a greater chance of recombining radiatively with each additional QW rather than being collected by a contact. And each quantum well augments all measures of the QE by creating a strong overlap between the electron and hole wavefunctions. So as the injection efficiency increases, the LED external QE does as well. As mentioned above, the emission wavelength can be controlled by modifying the recombination zone of the device displayed in FIG. 11(a) via In or Al fraction and quantum well width. This is similar to the design strategy in the prior art example of FIG. 1(c), but with the novel replacement of the traditional p-type layer with that of the unipolar doped bipolar tunneling design. The embodiment displayed in FIG. 11(a), has acceptable ranges for multiple parameters across the structure—these ranges and parameters are listed in Table II. It will be appreciated that this proposed intrinsic design can be transformed from an LED topology, to a planar laser or vertical laser configuration too.

Figure 11B:
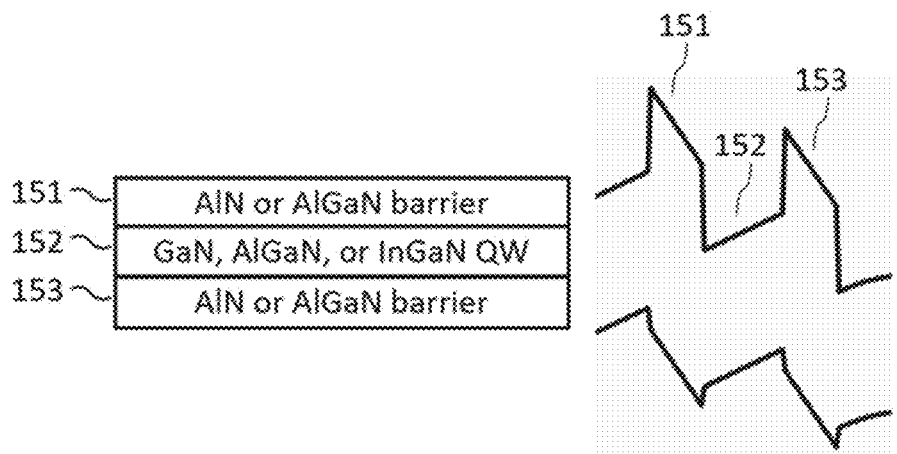

In the previous embodiment, layers 150 were described as a double barrier, shown here as FIG. 11(b). Here the double barrier is more clearly identified through the ranges for layers 151, 152, and 153 as listed in Table II.

TABLE II

Material Characteristics

FIG. 11(a) - MQW UDRT-LED top contact region n-type doping concentration: 5E16-2E20 cm$^{-3}$
top contact region thickness: 10-500 nm
top contact region composition: GaN, InGaN (1%-30% In), AlGaN (1%-90% Al)
UID top spacer thickness: 2-15 nm
UID top spacer composition: GaN, InN, InGaN (1%-99% In)
UID bottom spacer thickness: 1-50 nm
UID bottom spacer composition: GaN, InGaN (1%-100% In), AlGaN (1%-90% Al)
UID MQW region
    Number of QWs: 1-10
    QW composition: GaN, InN, InGaN (1%-99% In), AlGaN (1%-90% Al)
    QW thickness: 1-8 nm
    Number of barriers: 2-11
    Barrier composition: GaN, AlN, AlGaN (5%-99% Al)
    Barrier thickness: 1-10 nm
bottom contact region n-type doping concentration: 5E16-2E20 cm$^{-3}$
bottom contact region thickness: 10-1000 nm
bottom contact region composition: GaN, InGaN (1%-30% In), AlGaN (1%-90% Al)
substrate: GaN, Sapphire, AlN, SiC, Si FIG. 11(b) - Double barrier for 12(a)

UID top barrier composition: AlN, AlGaN (40%-99% Al)
UID top barrier thickness: 0.5-5 nm
UID quantum well composition: GaN, InN, InGaN (1%-99% In), AlGaN (1%-70% Al)
UID quantum well thickness: 1-8 nm
UID bottom barrier composition: AlN, AlGaN (40%-99% Al)
UID bottom barrier thickness: 1-8 nm

Single Barrier RTD-LED Basic Platform

The GaN—AlN double-barrier light-emitter structure described in FIGS. 2(a) and 3(a) and applied in FIGS. 10 and 11 is just one possible design using the unipolar-doped, cross-gap concept according to the innovation. This is useful for some novel concepts, such as highly coherent optical clocks described herein. But if the goal is just light emission, then a single-barrier structure may suffice such as that shown in FIG. 12, which is generally easier to grow epitaxially and easier to design too.

One difference between a double-barrier and single-barrier structure is the current density. Double barrier structures of barrier thickness, $t_{double}$, generally provide much more current density than a single barrier structure of thickness, $t_{single}$, at or near the double-barrier resonant bias voltage (i.e., where electrons injected from the emitter side have kinetic energy equal to the binding energy of one of the quasibound states in the quantum well between the two barriers). However, well away from the resonant bias condition, the double-barrier structure will provide even less current density than the single-barrier structure. So, optimization of the single-barrier structure for light emission may entail a different barrier thickness, probably thinner, than what has been used in a first demonstration with the double-barrier light emitter, i.e., 2.0 nm as shown in FIGS. 2 and 3.

An additional challenge is the charge balance between the forward electron current and the reverse (Zener tunneling generated) hole current. Mismatches will cause excessive carrier pooling, leading to shifts in the internal bias that would oppose carrier injection, similar to a bipolar junction transistor. A well-designed structure will incorporate a nearly 1:1 injection of electrons and holes at the optimal bias point. The Zener tunneling creates holes on the collector side that must then tunnel through the barriers to reach the recombination zone on the emitter side. But in the second step the holes experience a much smaller barrier than the electrons, so this step will likely be much more probable than the Zener tunneling itself. Hence, the Zener tunneling on the collector side becomes the bottleneck for total hole generation in the recombination zone. So, in addition to barrier-thickness, spacer-thickness on the collector side and doping profile will likely be important design parameters.

In one embodiment, there are acceptable ranges for multiple parameters across the structure—these ranges and parameters are listed in Table III.

The recombination zone in and around layers 230 and 240 (FIG. 12) can be tailored to specific emission wavelengths by the addition of quantum wells, like the design put forth in FIG. 11(*a*). FIG. 13 elucidates this proposed design where layer 300 has now been inserted as part of the recombination zone to control wavelength emission. In this embodiment, there are acceptable ranges for multiple parameters across the structure—these ranges and parameters are listed in Table III. Someone skilled in the art will perceive that this proposed intrinsic design can be transformed from an LED topology, to a planar laser or vertical laser configuration too.

TABLE III

Material Characteristics

Figure 12:
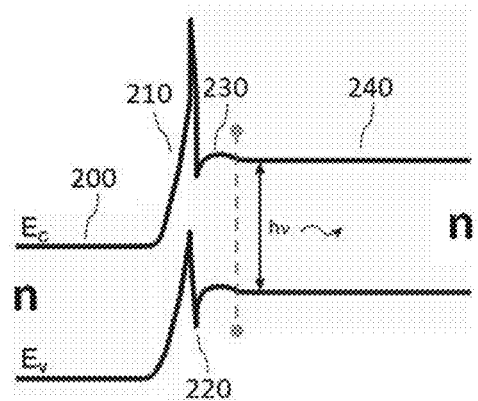
FIG. 12 depicts an example embodiment of unipolar doped resonant tunneling light emitting diodes according to the innovation.
Figure 13:
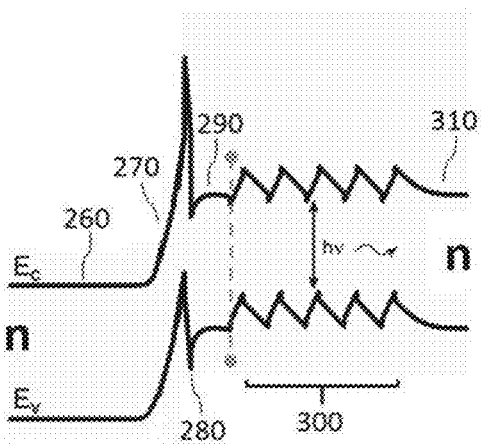
FIG. 13 depicts an example embodiment of unipolar doped resonant tunneling light emitting diodes according to the innovation.

FIG. 12 - Single barrier UDRT-LED top contact region n-type doping concentration: 5E16-2E20 cm$^{-3}$
top contact region thickness: 10-500 nm
top contact region composition: GaN, InGaN (1%-30% In), AlGaN (1%-90% Al)
UID top spacer thickness: 2-15 nm
UID top spacer composition: GaN, InN, InGaN (1%-99% In)
UID single barrier composition: AlN, AlGaN (40%-99% Al)
UID single barrier thickness: 0.5-5 nm
UID bottom spacer thickness: 1-50 nm
UID bottom spacer composition: GaN, InGaN (1%-100% In), AlGaN (1%-90% Al)
bottom contact region n-type doping concentration: 5E16-2E20 cm$^{-3}$
bottom contact region thickness: 10-1000 nm
bottom contact region composition: GaN, InGaN (1%-30% In), AlGaN (1%-90% Al)
substrate: GaN, Sapphire, AlN, SiC, Si FIG. 13 - Single barrier MQW UDRT-LED top contact region n-type doping concentration: 5E16-2E20 cm$^{-3}$
top contact region thickness: 10-500 nm
top contact region composition: GaN, InGaN (1%-30% In), AlGaN (1%-90% Al)
UID top spacer thickness: 2-15 nm
UID top spacer composition: GaN, InN, InGaN (1%-99% In)
UID single barrier composition: AlN, AlGaN (40%-99% Al)
UID single barrier thickness: 0.5-5 nm
UID bottom spacer thickness: 1-50 nm
UID bottom spacer composition: GaN, InGaN (1%-100% In), AlGaN (1%-90% Al)
UID MQW region
    Number of QWs: 1-10
        QW composition: GaN, InN, InGaN (1%-99% In), AlGaN (1%-90% Al)
        QW thickness: 1-8 nm
    Number of barriers: 2-11
        Barrier composition: GaN, AlN, AlGaN (5%-99% Al)
        Barrier thickness: 1-10 nm
bottom contact region n-type doping concentration: 5E16-2E20 cm$^{-3}$ TABLE III-continued Material Characteristics bottom contact region thickness: 10-1000 nm
bottom contact region composition: GaN, InGaN (1%-30% In), AlGaN (1%-90% Al)
substrate: GaN, Sapphire, AlN, SiC, Si Unipolar-Doped with InGaN Pre-Well The unipolar-doped interband-tunneling light emitter according to the innovation, be it an LED or an LD, and whether having a single- or double-barrier structure, will display even stronger emission at violet or blue wavelengths through the use of the ternary $In_xGa_{1-x}N$ alloys in the "pre-well" approach shown in FIG. 14(*a*). The addition of In with GaN generally reduces the direct bandgap significantly, which it why it has been used to make quantum wells in conventional p-n LEDs and LDs. And by adding an InGaN quantum well, the desired photon emission energy is not susceptible to self-absorption by the GaN cladding, thus increasing external quantum efficiency. By adding it to the emitter side in the structure, the electron-hole recombination will naturally occur at wavelengths longer than 360 nm, and more electrons will accumulate there than without the In incorporation, so the electron current density should increase too.

Because $In_xGa_{1-x}N$ is also non-centrosymmetric and polar, it should support a strong polarization effect and piezoelectric response of the first AlN barrier. The primary challenge will be the lattice mismatch between the $In_xGa_{1-x}N$ and the GaN around it, and this mismatch increases with In fraction x. If x gets too high or the width of the pre-well gets too large, or both, crystal defects will be formed (e.g., dislocations) that are generally deleterious to the electron and hole transport, particularly to the electron-hole radiative recombination efficiency. In this embodiment, there are acceptable ranges for multiple parameters across the structure—these ranges and parameters are listed in Table IV. In FIG. 14(*a*), layers 570 are the double barrier structure, which is shown in exploded view in FIG. 14(*b*). The limits on layers 571, 572, and 573 are listed in Table IV. Application of the InGaN prewell to the single barrier structure observed in FIG. 13(*a*) results in FIG. 14(*c*). In this embodiment, there are acceptable ranges for multiple parameters across the structure—these ranges and parameters are also listed in Table IV.

TABLE IV

Material Characteristics

Figure 14A:
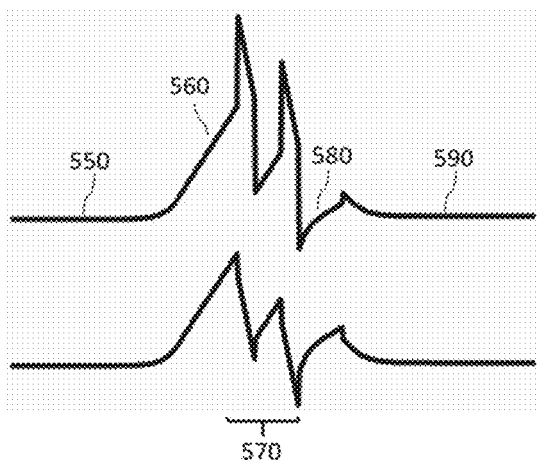
FIGS. 14A-14C depict example embodiments of unipolar doped resonant tunneling light emitting diodes according to the innovation.
Figure 14B:
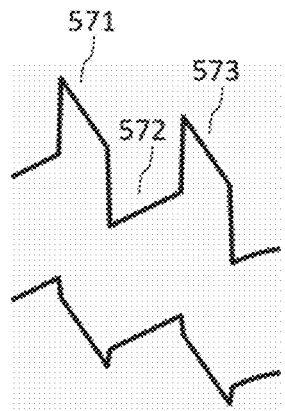
Figure 14C:
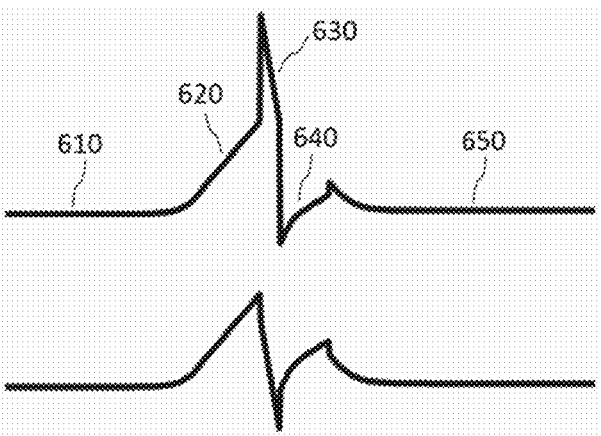

FIG. 14(a) - Double barrier UDRT-LED with InGaN prewell top contact region n-type doping concentration: 5E16-2E20 cm$^{-3}$
top contact region thickness: 10-500 nm
top contact region composition: GaN, InGaN (1%-30% In), AlGaN (1%-90% Al)
UID top spacer thickness: 2-15 nm
UID top spacer composition: GaN, InN, InGaN (1%-99% In)
UID InGaN prewell thickness: 1-8 nm
UID InGaN prewell composition: InN, InGaN (5%-99% In)
bottom contact region n-type doping concentration: 5E16-2E20 cm$^{-3}$
bottom contact region thickness: 10-1000 nm
bottom contact region composition: GaN, InGaN (1%-30% In), AlGaN (1%-90% Al)
substrate: GaN, Sapphire, AlN, SiC, Si FIG. 14(b) - Double barrier for 14(a)

UID top barrier composition: AlN, AlGaN (40%-99% Al)
UID top barrier thickness: 0.5-5 nm

TABLE IV-continued

Material Characteristics

UID quantum well composition: GaN, InN, InGaN (1%-99% In), AlGaN (1%-70% Al)
UID quantum well thickness: 1-8 nm
UID bottom barrier composition: AlN, AlGaN (40%-99% Al)
UID bottom barrier thickness: 1-8 nm
FIG. 14(c) - Single barrier UDRT-LED with InGaN prewell top contact region n-type doping concentration: 5E16-2E20 cm$^{-3}$
top contact region thickness: 10-500 nm
top contact region composition: GaN, InGaN (1%-30% In), AlGaN (1%-90% Al)
UID top spacer thickness: 2-15 nm
UID top spacer composition: GaN, InN, InGaN (1%-99% In)
UID single barrier composition: AlN, AlGaN (40%-99% Al)
UID single barrier thickness: 0.5-5 nm
UID InGaN prewell thickness: 1-8 nm
UID InGaN prewell composition: InN, InGaN (5%-99% In)
bottom contact region n-type doping concentration: 5E16-2E20 cm$^{-3}$
bottom contact region thickness: 10-1000 nm
bottom contact region composition: GaN, InGaN (1%-30% In), AlGaN (1%-90% Al)
substrate: GaN, Sapphire, AlN, SiC, Si

TABLE V

Material Characteristics

Figure 15A:
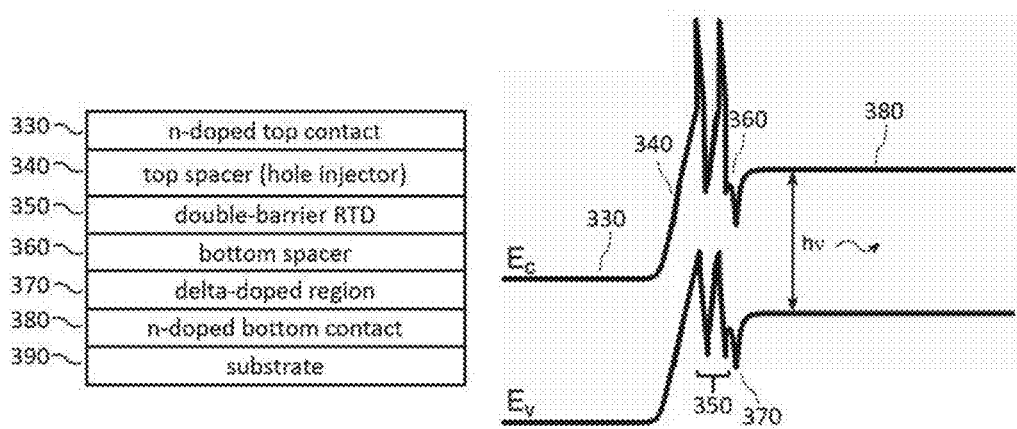
FIGS. 15A-15B depict example embodiments of unipolar doped resonant tunneling light emitting diodes according to the innovation.
Figure 15B:
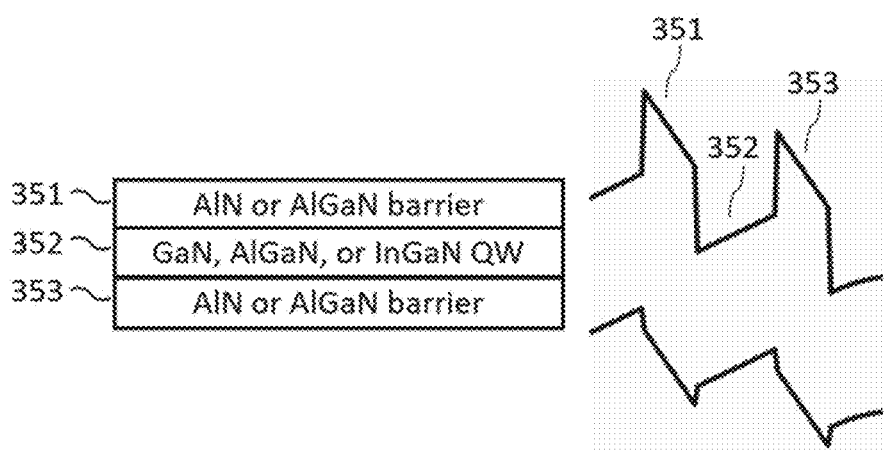

FIG. 15(a) - Double barrier UDRT-LED with delta-doping top contact region n-type doping concentration: 5E16-2E20 cm$^{-3}$
top contact region thickness: 10-500 nm
top contact region composition: GaN, InGaN (1%-30% In), AlGaN (1%-90% Al)
UID top spacer thickness: 2-15 nm
UID top spacer composition: GaN, InN, InGaN (1%-99% In)
UID bottom spacer thickness: 1-5 nm
UID bottom spacer composition: GaN, InGaN (1%-100% In), AlGaN (1%-90% Al)
delta doping with an n-dopant at dose levels between $10^{12}$ and $10^{14}$ cm$^{-2}$
bottom contact region n-type doping concentration: 5E16-2E20 cm$^{-3}$
bottom contact region thickness: 10-1000 nm
bottom contact region composition: GaN, InGaN (1%-30% In), AlGaN (1%-90% Al)
substrate: GaN, Sapphire, AlN, SiC, Si
FIG. 15(b) - Double barrier for 15(a)

UID top barrier composition: AlN, AlGaN (40%-99% Al)
UID top barrier thickness: 0.5-5 nm
UID quantum well composition: GaN, InN, InGaN (1%-99% In), AlGaN (1%-70% Al)
UID quantum well thickness: 1-8 nm
UID bottom barrier composition: AlN, AlGaN (40%-99% Al)
UID bottom barrier thickness: 1-8 nm
FIG. 15(c) - Single barrier UDRT-LED with delta-doping top contact region n-type doping concentration: 5E16-2E20 cm$^{-3}$
top contact region thickness: 10-500 nm
top contact region composition: GaN, InGaN (1%-30% In), AlGaN (1%-90% Al)
UID top spacer thickness: 2-15 nm
UID top spacer composition: GaN, InN, InGaN (1%-99% In)
UID single barrier composition: AlN, AlGaN (40%-99% Al)
UID single barrier thickness: 0.5-5 nm
UID bottom spacer thickness: 1-5 nm
UID bottom spacer composition: GaN, InGaN (1%-100% In), AlGaN (1%-90% Al)
delta doping with an n-dopant at dose levels between $10^{12}$ and $10^{14}$ cm$^{-2}$
bottom contact region n-type doping concentration: 5E16-2E20 cm$^{-3}$
bottom contact region thickness: 10-1000 nm
bottom contact region composition: GaN, InGaN (1%-30% In), AlGaN (1%-90% Al)
substrate: GaN, Sapphire, AlN, SiC, Si Unipolar-Doped LED with Delta-Doped "Pre-Well"

An In-composition pre-well is a promising idea but adds difficulty to the epitaxial growth because of the lattice-mismatch induced strain, and because it requires a third cationic species in addition to Ga and Al during the epitaxial growth. A simpler way to create a "pre-well" that can support light emission at wavelengths in the visible region below the GaN band gap may be delta doping. This is a common technique in MBE growth and quite effective when the dopant incorporates as well as Si does in GaN. With n-type delta doping, a triangular-like potential well is created in the region around the delta-doped region as shown in FIG. 15(a). Electrons will occupy quantum states in this well and will realize degenerate populations in the lower of these states, much like in the InGaN quantum well.

Figure 16:
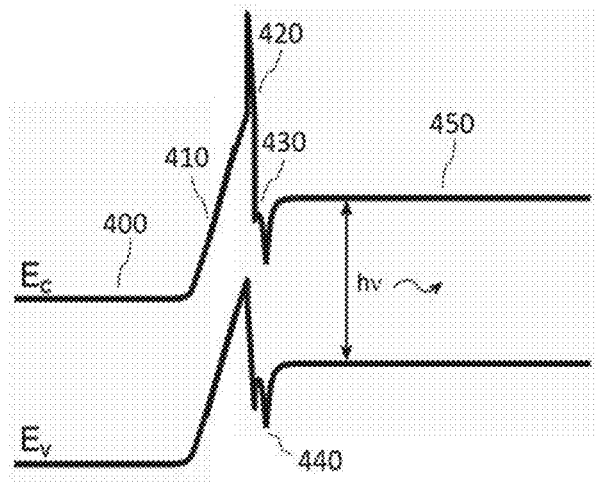
FIG. 16 depicts an example embodiment of unipolar doped resonant tunneling light emitting diodes according to the innovation.

The triangular band bending that occurs in the delta-doped region greatly affects the electron potential, so a similar-but-opposite effect must occur for the holes in the valence band. In other words, the holes in the delta-doped region see a potential barrier, not a potential well. This then makes the quantum well between the AlN barriers the most likely region of occupancy for the holes from a thermodynamic standpoint with a corresponding hole sheet density that is very high and fed by the strong Zener tunneling from the collector side. Although the electron sheet density in the delta-doped pre-well and the hole sheet density in the AlN-barrier confined quantum well are spatially separated, their mutual sheet densities should be high enough that the electron-hole recombination efficiency is sufficiently high for LD or LED operation. In this embodiment, there are acceptable ranges for multiple parameters across the structure—these ranges and parameters are listed in Table V. In the previous embodiment, layers 350 were described as a double barrier. Here the double barrier is more clearly identified. The limits on layers 351, 352, and 353 are also listed in Table V. Application of the delta-doped prewell to the single barrier structure observed of FIG. 13 results in FIG. 16. In this embodiment, there are acceptable ranges for multiple parameters across the structure—these ranges and parameters are listed in the Table V.

Unipolar-Doped Interband Ultraviolet Emitter

There are applications at shorter wavelengths, such as UV sterilization of domestic water and of exposed surfaces in hygienic settings (like surgery rooms), which are growing in popularity. This is because certain wavelengths of UV radiation are very effective in killing dangerous bacteria like *E-coli*. The wavelength range that has been found to be most effective is 240-280 nm because this is where the DNA of the bacterial cells is broken by the UV photons in an irreversible way described later in this specification. The 240-280 nm range lies in the middle-UV region (defined historically as λ=200-300 nm), but better defined technologically as the UV C-band (λ=100-280 nm). And these wavelengths have been difficult to realize in a facile way using conventional GaN-based LED/LD technology, as the p-type doping parasitic resistances are exacerbated with the wider bandgap Al-containing AlGaN-based structures to reduce the emission wavelengths.

The presence of Al in the alloy increases the direct bandgap to 4.77 eV, consistent with the fact that the GaN bandgap is ≈3.4 eV, and the AlN bandgap is ≈6.2 eV, and the ternary alloys always tend to have a bandgap intermediate between those of its binary constituents.

Figure 17:
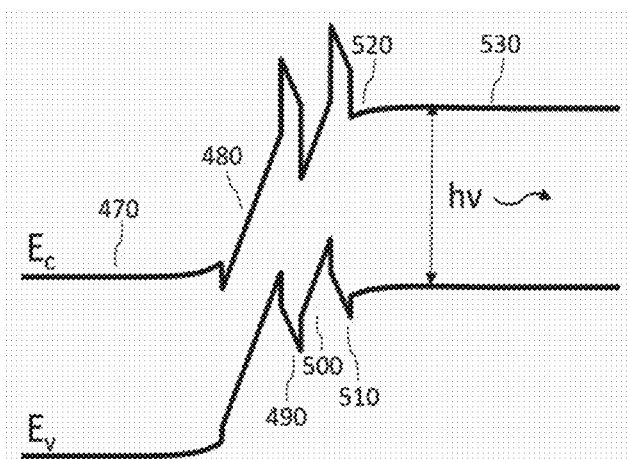
FIG. 17 depicts an example embodiment of unipolar doped resonant tunneling light emitting diodes according to the innovation.

Otherwise, the behavior of the device is the same as that shown graphically in FIG. 3(a). Under "forward" bias (positive potential applied on the collector side relative to the emitter side), electrons accumulate on the emitter side to create the "supply" for resonant tunneling. Holes are created on the collector side by Zener tunneling, and these holes then tunnel to the emitter side where they participate in radiative recombination with electrons at the bandgap photon energy (4.77 eV), which corresponds to a photon wavelength of 260 nm—right in the middle of the UV-sterilization band. FIG. 17 shows the proposed UV emitter design. In this embodiment, there are acceptable ranges for multiple parameters across the structure—these ranges and parameters are listed in Table VI.

TABLE VI

Material Characteristics
FIG. 17 - AlGaN UV Emitter top contact region n-type doping concentration: 5E16-2E20 $cm^{-3}$
top contact region thickness: 10-200 nm
top contact region composition: AlGaN (1%-95% Al)
UID top spacer thickness: 2-8 nm
UID top spacer composition: GaN, AlGaN (1%-20%Al)
UID bottom spacer thickness: 1-50 nm
UID bottom spacer composition: AlGaN (1%-80% Al)
bottom contact region n-type doping concentration: 5E16-1E20 $cm^{-3}$
bottom contact region thickness: 10-1000 nm
bottom contact region composition: AlGaN (1%-95% Al)
substrate: AlN or sapphire Unipolar-Doped Resonant Tunneling Light Emitting Diode—Lighting Applications Wavelengths of light in the visible window (~390-700 nm) have many applications, however, despite good efficacy, high up-front costs, reliability concerns, and compatibility issues have deterred many consumers. Much of this cost is incurred due to complex manufacturing techniques which are needed to navigate the p-type dopant related issues which were discussed earlier. Many of these issues can be eliminated by using the devices according to the innovation.

One common method for achieving white light is to use high energy near-UV/blue emitters to pump phosphors which down-convert to green and red, thus allowing for white light production when mixed. Another method is to simply use multiple primary (red, green, blue, amber) LEDs, however this introduces complexity because each must be grown separately. With no phosphor down conversion losses, however, this could result in very high efficiencies. Using the devices according to the innovation should directly enable either method. The first method would be possible by using the designs in FIGS. 10-17 and selecting the various parameters in Tables I, II, III, IV, V, and VI in such a way as to allow for near-UV/blue (~350-450 nm) emission which would be utilized to pump the appropriate phosphors and down-convert to green and red light emission, thus allowing for white light when mixed with the blue. The second method would be possible by using the designs in FIGS. 10-16 and selecting the various parameters in Tables I, II, III, IV and V in such a way that would allow for light emission at the required colors (red, green, blue, amber, etc.).

Another possibility would be to use the innovations detailed previously (FIGS. 10, 12, and 14) as a replacement for the p-type layer in prior art white LEDs. State-of-the-art LEDs are pn junctions, wherein the p-type layer is responsible for injecting holes into the active region, thus allowing for recombination with the injected electrons from the n-type layer. Then, application of one of the two methods described in the previous paragraph for creating white light is applied. Using the devices according to the innovation, should allow for the complete replacement of the p-type layer. This would be possible because the structures detailed previously (FIGS. 10, 12, and 14) could be used as a hole injection source, thus making the device completely n-type.

GaN Unipolar-Doped Interband Vertical Cavity Laser and LED

Figure 18:
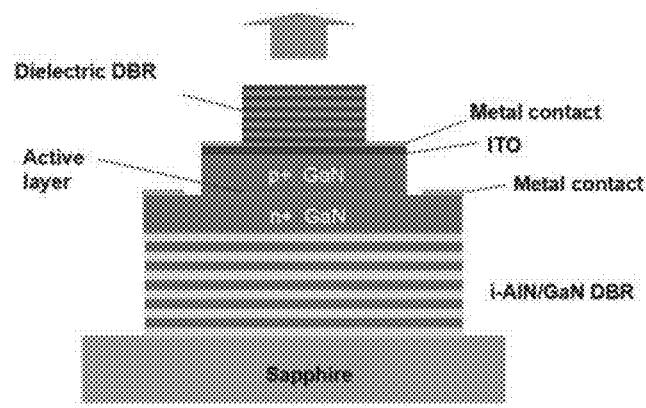
FIG. 18 is an illustration depicting a bipolar GaN-based VCSEL in cross-section. A p-doped GaN region is required for hole carrier injection, while a n+ region is for electron injection. A thin ITO layer is located next to the proximity of the p+ GaN region to facilitate hole carrier spreading.
Figure 19:
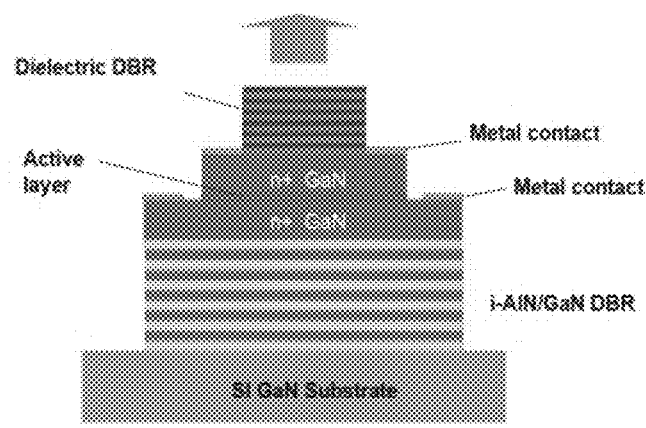
FIG. 19 is an illustration depicting a unipolar-doped VCSEL structure in cross-section. Both contact regions are n+ type, which has much higher conductivity than any p-type GaN currently known. Thus no ITO layer is necessary as in the p-n VCSEL of FIG. 2.

Combining the proposed UDRT light emitters with a GaN/AlN dielectric mirror (distributed Bragg reflector), may provide the unipolar n-doped VCSEL structure shown in cross section in FIG. 19. Lacking the p+ doped regions of the traditional GaN p-n VCSEL of FIG. 18, the unipolar-doped GaN heterostructure can support higher currents without a lossy ITO layer. In fact, the VCSEL structure of FIG. 19 is very much like the highly successful GaAs-based p-n diode VCSELs in widespread use around the world today. But the unipolar-doped GaN structure offers advantages over the GaAs structure, including superior thermal characteristics. Both GaN and AlN have much higher thermal conductivity than their counterparts GaAs and AlAs, which allows the VCSELs to be driven with more current, and emit more power, before thermally induced failure.

Even in the absence of lasing action, perhaps because of optical losses in the n++ layers, the structure in FIG. 19 will still operate as a "super" LED because the dielectric mirrors will favor vertical emission over lateral emission. This will also reduce the number of layers of GaN and AlN required in the dielectric-mirror stack. Deposited dielectric mirrors that lack critical thickness constraints, could also be utilized. The top would be as-grown and the bottom could be added after substrate wafer thinning.

Figure 1B:
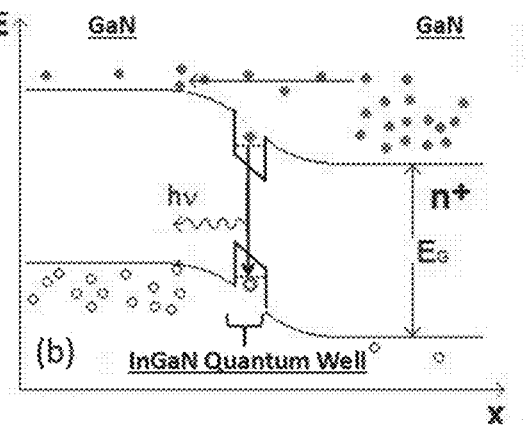
Figure 1C:
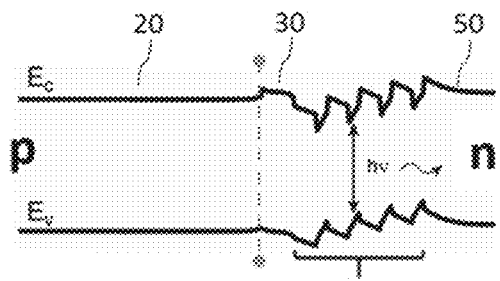

The LED and LD light emission according to the innovation rely on electron-hole recombination. The holes are generated by a local interband tunneling process that occurs because of the strong electric field created by the polarization and piezoelectric effects. This is quite different from p-n junction GaN LED/LDs where the holes necessary for cross-gap emission are created by classical drift from the p-doped region into the depletion region, as shown in FIG. 1. Essentially, holes are generated around the very physical location they are needed, without the troublesome issues of bringing them in from the anode contact.

The unipolar n-doped VCSEL structure can be primarily designed for 360 nm lasing, but can also be tailored for long wavelength lasing as well if one of the prewell or MQW structures are implemented (Tables II, III, IV, and V). Furthermore, UV lasing (240-360 nm) can be accomplished by implementing the VCSEL design with the embodiment detailed in Table VI.

Optoelectronic Circuit Application

GaN RTD-LED/LD Optical Clock

Through the combination of NDR already demonstrated, and intense light emission, new device concepts that combine both fascinating characteristics can be envisioned. The first is an optical clock. It is well known that the NDR region of RTDs can support electrical oscillations of two different types. The best known is a sinusoidal oscillation created by connecting the RTD to a lumped-element LC tank circuit. By biasing the RTD into the middle of the NDR region, and assuming the tank circuit has low enough losses, the resulting sinusoidal oscillation frequency is $f \approx [2\pi(LC)^{1/2}]^{-1}$. But it requires low-loss inductors and capacitors, which are non-trivial to fabricate monolithically on the same substrate as the GaN RTD/light-emitter of FIG. 20.

Figure 20A:
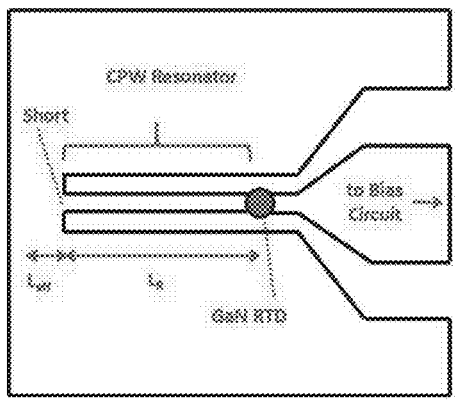
FIGS. 20A-20C depicts a diagram and analyses of an RTD structure according to the innovation. (a) Top view of RTD coupled to a coplanar transmission line to make a relaxation oscillator. (b) I-V curve of RTD undergoing relaxation oscillations with four characteristic points illustrated. (c) Voltage waveform across RTD showing the same four points as in (b), and the impulsive nature that results from the fast RTD switching.
Figure 20B:
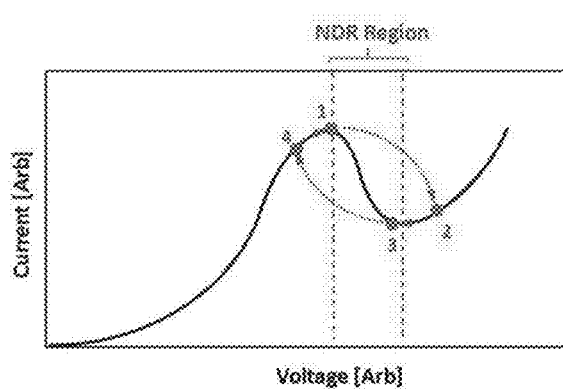
Figure 20C:
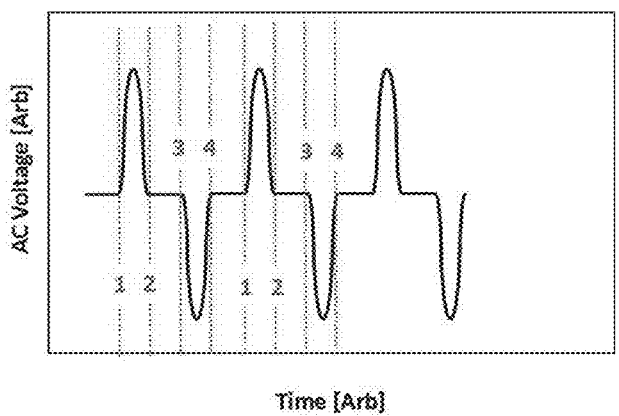

A better approach to make RTDs oscillate is the transmission-line relaxation oscillator approach of FIG. 20(a) Here the RTD is connected to a transmission line that is shorted at one end, the transmission line shown in FIG. 20(a)

being a coplanar waveguide. The RTD is then biased to just below the peak voltage or just beyond the valley voltage of FIG. 20(b), and induced to switch to the valley or peak points, respectively, by a small variation or fluctuation of the bias voltage. The fast switching action of RTDs creates a voltage pulse that propagates down the transmission line to the short, and then reflected and inverted in sign. When the reflected pulse gets back to the RTD, it induces the alternate switching event. Given a low-loss transmission line and weak coupling through the DC bias circuit, the sequence of pulses is self-sustaining as shown graphically in FIG. 20(c), and has repetition frequency $f_{rep} \approx (4T_p)^{-1}$ where $T_P$ is the pulse propagation time between the RTD and the short circuit.

Figure 21A:
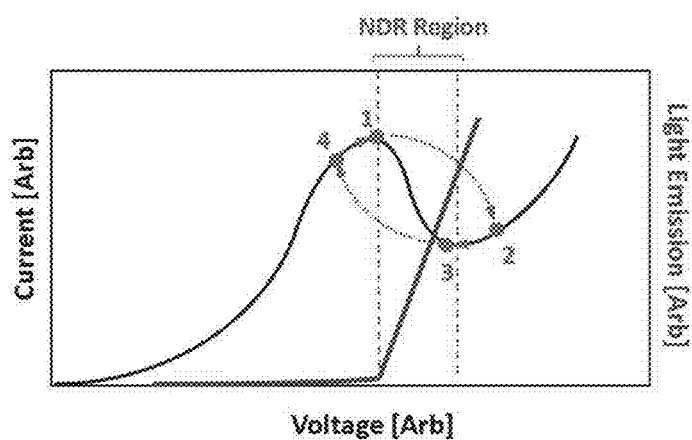
FIGS. 21A and 21B depict analyses of the same RTD structure as in FIG. 20A. (a) The same RTD I-V curve as in FIG. 20B superimposed with the L-V curve assuming that the threshold voltage of the light emission is at or near the peak voltage of the RTD NDR region. (b) Same RTD relaxation oscillator waveform as in FIG. 20C superimposed with the corresponding light emission waveform, resembling an ideal optical clock.
Figure 21B:
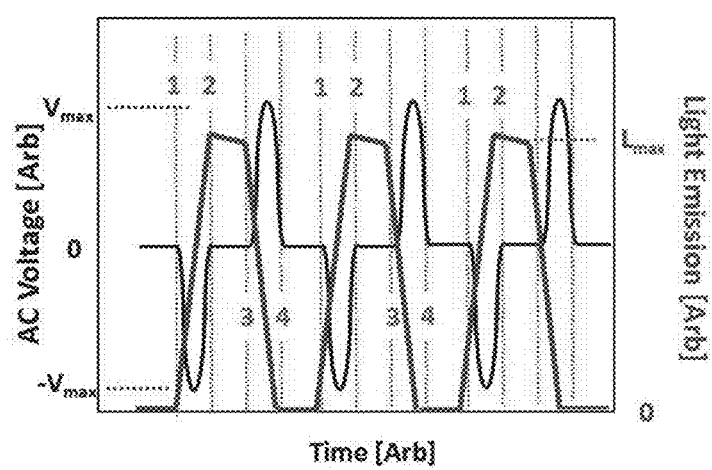

Now suppose that the RTD structure is the GaN unipolar-doped light-emitter, and that the light emitting threshold voltage is close to the peak voltage of the NDR region as shown graphically in FIG. 21(a) (violet curve). Then, as the RTD switches between the peak and valley points during sustained relaxation oscillations, the light emitted by the GaN structure is varying from off-to-on with a difference that depends on the width of the NDR region in voltage. But independent of this difference, the emitted light should have a square-wave like behavior in the time domain, as shown in FIG. 21(b) (violet curve). In other words, it should behave as an optical "clock". The rise and fall times of the light waveform has not been characterized, but judging from the unipolar nature of the GaN emitter, could be much faster than the rise and fall times of a conventional p-n LED emitter.

The optical clock according to the innovation provide frequency stability, usually quantified by timing "jitter" of the rising and falling edges. RTD relaxation oscillations are known to be extremely stable, in part because the peak and valley points of unipolar RTDs are robust with respect to temperature, power supply fluctuations, etc. Hence, it is expected that the resulting optical clock will also be very stable. And unlike alternative optical clocks, such as atomic clocks, the RTD-emitter optical clock can be integrated into GaN circuits to carry out optical signal processing, lidar transmission, and perhaps optical computing.

System Application: Ultraviolet Sterilization

Background

As mentioned above, a useful application of the UV emission from the unipolar-doped GaN tunneling structures is sterilization of domestic (e.g., drinking) water. Water cleanliness is still a major health problem worldwide because of the many harmful bacteria that act as pathogens. This includes enterotoxigenic *Escherichia coli*, or *E. coli* for short (a primary cause of chronic diarrhea, and 7$^{th}$ leading of death worldwide); *Vibrio cholerae* (the primary cause of cholera); and a variety of *Campylobacter* species (primary cause of campylobacteriosis). A related application is sterilization of food and hygienic surfaces, including those in clinical and industrial laboratories. This also benefits from the generic vulnerability of bacteria to UV light, a good example being *Salmonella enterica* (serotype *Typhi*; a primary cause of typhoid fever); 40 species of genus *Staphylococcus* (a common cause of bacterial infections in open wounds or from surgery); and approximately 50 species of genus *Streptococcus* associated with a variety of maladies including bacterial pneumonia and necrotizing fasciitis (i.e., "flesh eating" bacteria). Protozoa and viruses are two other types of pathogens targeted by the technology. For example, most of the waterborne protozoan specimens like *Giardia lamblia* will succumb to powerful UV in the same 240-280 nm band. And most if not all of the influenza virus strains that scourge the world every year are subject to sterilization by the same UV wavelength region. However, protozoa are generally waterborne, and influenza viruses are either airborne or surface-bearing. As described herein, different optical-coupling methodologies must be adopted to deal with these diverse organisms.

Figure 22A:
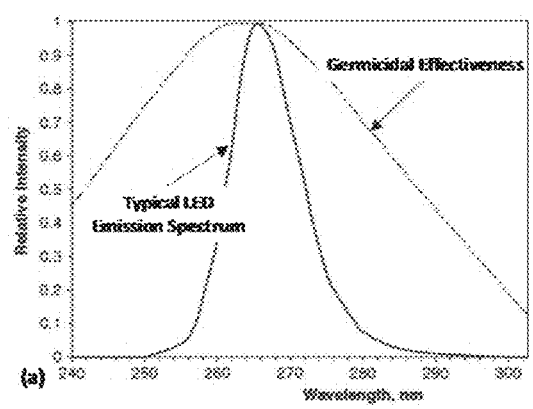
FIGS. 22A and 22B are graphs representing sterilization effectiveness of an embodiment according to the innovation. a) *E-coli* germicidal spectral effectiveness curve compared to typical UV-C LED emission spectrum UV-C LED emitting 265 nm compared to *E. coli* germicidal effectiveness curve. (b) Absorption coefficient of clear water with the UV-C sterilization band superimposed.

Independent of the specific organism, the UV-C region between $\lambda \sim 240$ and 280 nm (the sterilization band) is particularly advantageous, and displays a typical "germicidal effectiveness" curve as shown in FIG. 22(a) In this range the UV photons break the inter-atomic bonds in DNA and RNA molecules of all sorts, not just those of bacteria. Interestingly, in DNA the damage starts by breaking the bond between the nucelobase thymine and its complementary partner adenine, and then the permanent damage occurs when the liberated thymine molecule re-binds with another UV-liberated thymine if it happens to be a nearest neighbor in the DNA molecule. The resulting thymine "dimer" is stable thermodynamically so doesn't get repaired by normal biological processes. An individual cell or virus with its nuclear DNA so inflicted is incapable of reproducing properly; hence, it becomes sterile. At sufficiently high doses, all waterborne enteric pathogens are sterilized by UV radiation. The general order of microbial resistance (from least to most) and corresponding UV doses for extensive (>99.9%) sterilization are: (1) vegetative bacteria and the protozoan parasites at low doses (1-10 mJ/cm$^2$), and (2) enteric viruses and bacterial spores at high doses (30-150 mJ/cm$^2$).

Figure 22B:
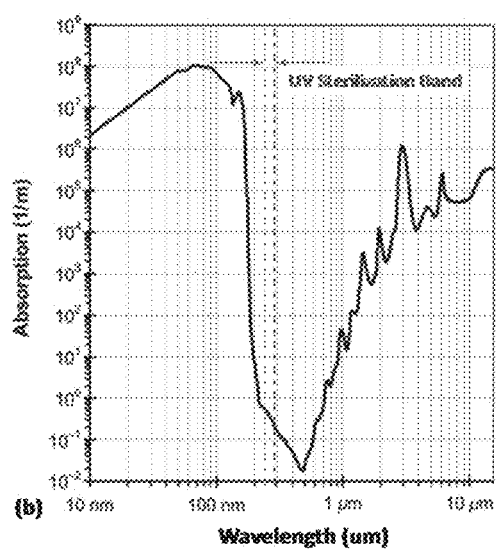

The sterilization band is superimposed on the transmittance behavior of clear water in FIG. 22(b) where a low absorption coefficient (<1 m$^{-1}$) is seen. This means even after 1 m of propagation, the majority of UV-C photons remain unabsorbed. So if bacteria are the only other absorbing constituent, it would have to be in a relatively high concentration to change the behavior in FIG. 22(b). But in the type of water generally treated by UV for sterilization, the concentration of bacteria is generally low in an absolute sense. Hence an important metric becomes the external killing efficiency (EKE), which is defined by the ratio of the number of bacterial cells sterilized to the number of UV-C photons incident on the sample.

Existing Technology

The established technology for water sterilization is either low-pressure mercury discharge tubes or solid-state LEDs. Hg discharge tubes are similar to a normal fluorescent light bulb but containing an inert gas plus a few drops of liquid mercury which ionizes and forms a plasma once electrical bias is applied. Ionized mercury atoms have a strong emission centered at $\lambda=254$ nm—in the middle of the sterilization band. Most low-pressure mercury lamp UV disinfection systems can readily achieve UV radiation doses of 50-150 mJ/cm$^2$ in high quality water, and therefore efficiently disinfect essentially all waterborne pathogens. However, like most "discharge" tubes, the mercury bulbs degrade in performance gradually over time and so must be replaced periodically, generally at least once per year. In addition, they require wall socket voltages (110 V or above) to operate properly, which in remote locations may or may not be available, Finally, they are subject to several failure mechanisms, perhaps the most damaging being the breakage of the bulb and the transfer of the highly toxic liquid mercury into the water being sterilized.

Because of these drawbacks, LEDs have been pursued for water sterilization applications for decades, the first promising semiconductor material being SiC. However, as an indirect bandgap semiconductor, SiC is not nearly as efficient in emission as GaN and cannot practically be designed for the sterilization band 240-280 nm. Hence, GaN has been pursued for the past 10 years or so but it too has problems emitting in the sterilization band since the room-temperature bandgap of GaN corresponds to a wavelength of 360 nm. And as described in detail above, GaN brings significant challenges in p-type doping, ohmic contacts, etc., and each challenge brings with it significant cost. For example, a fully packaged GaN LED operating around 250 nm costs ~$600 for a 1 mW light emission.

Improved UV-C Unipolar-Doped GaN LEDs and Two-Dimensional Arrays

It is possible to fabricate 2D arrays of the GaN/AlN LEDs taking advantage of the simplified growth and fabrication, and uniformity in performance that the unipolar-doping approach provides. This should continue to be true even for the UV-C compatible LED design having AlGaN (Al fraction≈0.5) instead of GaN in the cladding layers outside the tunneling region. However, to be superior to existing LED technology based on SiC- or GaN-based emitters, there needs to be an improvement in the external quantum efficiency (EQE) as measured by the ratio of the total rate of emitted UV-C photons that escape the device structure to the electron current crossing the device structure. Equally important is to ensure that this EQE is dominated by vertical emission since that is the emission direction that reinforces as multiple devices are combined to form 2D arrays. Since the UV emission within the active region of the unipolar-doped LED is approximately isotropic, the EQE problem is challenging and multi-faceted.

Figure 23A:
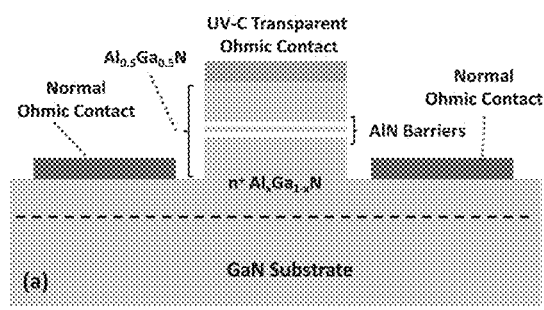
FIGS. 23A and 23B are cross-sectional views of unipolar-doped bipolar tunneling LED. (a) Cross-sectional view of unipolar-doped bipolar-tunneling LED showing a transparent optical contact on top for increased EQE. (b). Same as (a) except for the addition of a reflecting layer near the bottom of the $Al_xGa_{1-x}N$ active layer and consisting of GaN quantum dots.

There are two concepts for improving the EQE greatly in the vertical direction. The first, shown in FIG. 23(a) entails a top ohmic contact that is transparent to the UV-C radiation between 240 and 280 nm in the sterilization band. Transparent ohmic contacts (TOCs) are not new in the photonic field, having been used for decades on detectors and emitters alike. A good example is indium-tin-oxide (ITO)—a semi-metallic alloy that offers good electrical conductivity at low frequencies (down to DC), but very low conductivity at infrared wavelengths. In other words, ITO acts like a metal at or near DC but an insulator at IR or shorter wavelengths. The physics behind this remarkable behavior is the plasma-edge effect in optics, whereby the material strongly reflects radiation at frequencies below the plasma resonance, but transmits radiation above the resonance. However, if the material is crystalline or polycrystalline, it is also important that its "effective bandgap" occur at shorter wavelengths than 260 nm, or equivalently at energy greater than ~4.6 eV. This then requires a wide bandgap material with high electrical conductivity, but not too high. Two candidate materials are $Ga_2O_3$, and BN.

There is no reason why the same effect cannot be used to make a metal alloy act like a good conductor at or near DC, but be transparent in the sterilization band. The important point here is that the metal must be kept very thin, approximately the classical skin depth or less. One promising candidate will be a Ti:Ni:Au alloy. The Ti in such an alloy will provide for good adhesion of the metal to the GaN on top of the active device mesa, as shown in FIG. 19. However, consistent with metal alloy physics, the Ti:Ni:Au alloy will have optical conductivity less than either of its three constituents, so probably display a plasma edge in the visible or near-UV regions. Note that this TOC approach is facilitated by the relatively short wavelength 240-280 nm of the sterilization band compared to any of the visible bands (violet, blue, or green) commonly being pursued in GaN-based LEDs for lighting applications. In general, the shorter the wavelength, the easier it is to find a metal displaying a plasma-edge at a longer wavelength. However, getting the effective bandgap(s) to wavelengths below the 240-280 nm band is another matter.

Figure 23B:
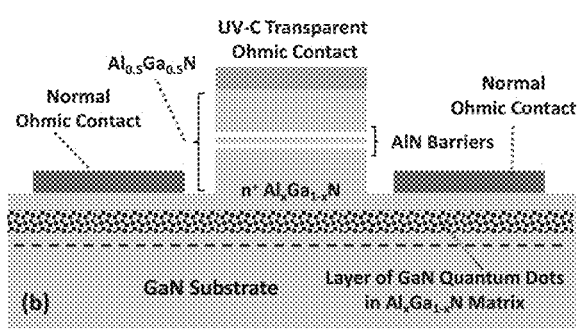

The second concept for improving the vertical EQE is displayed in FIG. 23(b). It consists of an embedded GaN quantum-dot layer created during epitaxial growth and located at some distance below the active region of the GaN-based LED. Its role is to reflect UV-C radiation that is emitted downward by the active device, back toward the vertical direction and transmitted through the TOC. This takes advantage of the fact that to emit in the sterilizing radiation band (240-280 nm), $Al_xGa_{1-x}N$ (x≈0.5) must be used in the cladding layers on both sides of the active region. But at such high Al fraction, it is possible to create GaN quantum dots spontaneously during the epitaxial growth. In addition, because the GaN bandgap is smaller than the $Al_xGa_{1-x}N$, the GaN quantum dots will be optically active (i.e., be occupied by electrons), meaning that their bound transitions will be dipolar and will scatter radiation very effectively. The obvious beneficial aspect of such resonant scattering is that it produces strong back-reflection. In other words, the embedded layer of GaN quantum dots in FIG. 23(b) will act like a "distributed mirror". UV-C photons emitted in the active region and downward-directed will be reflected by the "distributed mirror", pass back through the active region (with a small probability of absorption), and then transmit through the top TOC and contribute positively to the EQE performance metric.

Figure 24:
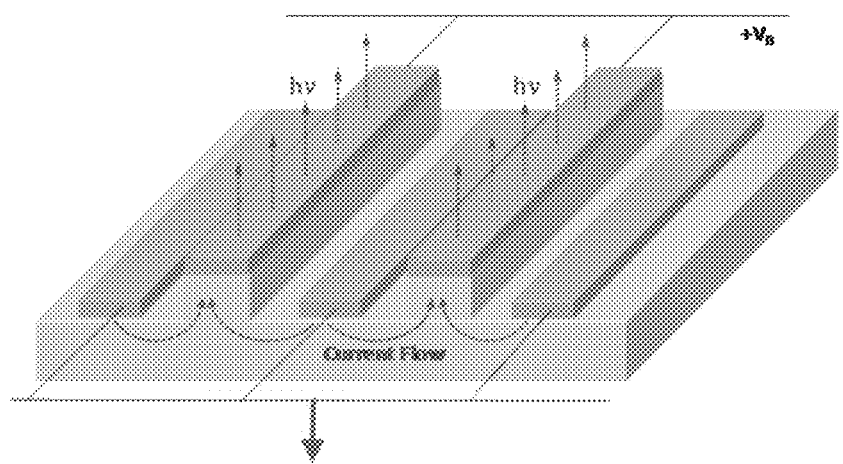
FIG. 24 is a perspective view of a 2D array of LEDs such as those of FIG. 19 in the form of parallel stripes each emitting UV-C photons primarily in the vertical direction.

Given these improvements in the EQE through LED materials design and fabrication, the extension to 2D arrays becomes relatively straightforward. FIG. 24 shows such an array as a collection of LED "stripes". Such stripes are known to be electronically and thermally stable compared to large-area device alternatives, so a 2D array of them should work well provided their inter-strip separation is great enough. Assuming each stripe has the vertical EQE technology shown in FIGS. 23(a) and (b), the power emitted vertically should increase linearly with the number of stripes in the array.

Optical Coupling for Sterilization Applications

Given the above conceptual improvements in the unipolar-doped GaN LED structure and its extension to 2D emitting arrays, there remains the issue of coupling the resulting 2D UV-C arrays into free space for the anticipated biological sterilization applications. And this depends on the two targeted applications: (1) sterilization of domestic drinking water, and (2) sterilization of hygienic surfaces in locations like hospital surgery rooms.

Figure 25A:
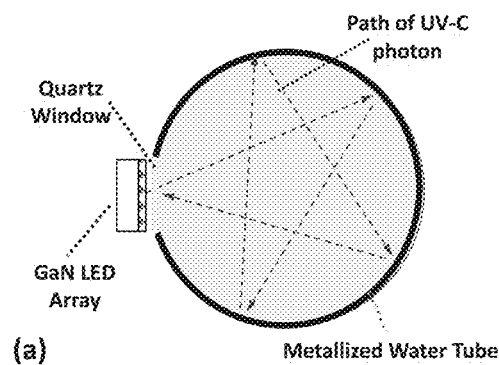
FIGS. 25A and 25B depicts a diagram showing a) A method for configuring the UV-C LED array of FIG. 24 to a tube for the purpose of water sterilization. (b). A method for coupling the LED array to beam collimating optics for the purpose of hygiene surface and object sterilization.

FIG. 25(a) shows the anticipated application of the 2D unipolar-doped GaN LED arrays to the sterilization of water. It is based on four plausible assumptions: (1) that the water to be sterilized will be flowing through a round tube (or "pipe"); (2) that the tube diameter is less than the ~1 m absorption length for UV-C photons in clear water displayed in FIG. 22(b); (3) that the tube can be coated on the inner surface with a metal that reflects photons in the sterilization band very effectively, and (4) the water is "clear", free of turbidity (likely from a previous filtering step), and contains but a small concentration of toxic cells or other bioparticles. For assumption#3, a good candidate metal would be titanium or one of its alloys which are both chemically inert and have a plasma-edge wavelength well below the sterilization band. Given these assumptions, then the powerful unipolar-doped GaN LED array can be located external to the water tube and coupled into the tube through a quartz window. The vast majority of the sterilizing UV photons will then enter the tube but not be absorbed on the first pass because of low turbidity and bacterial concentration. However, the metal coating on the inner surface of the sterilizing tube section will reflect the unabsorbed UV-C photons, giving them a second chance for absorption by the bacteria or other biomaterial in the tube. Moreover, if they are not absorbed on the second pass, then a subsequent reflection will occur, giving them a chance for absorption on the third pass, etc. The so-called "re-cycling" of UV photons will create a much higher external kill efficiency (EKE) than would otherwise occur. And this means that the UV-C LED array can have much lower power (and thus lower cost) than if the photons had only a single pass through the water.

Figure 25B:
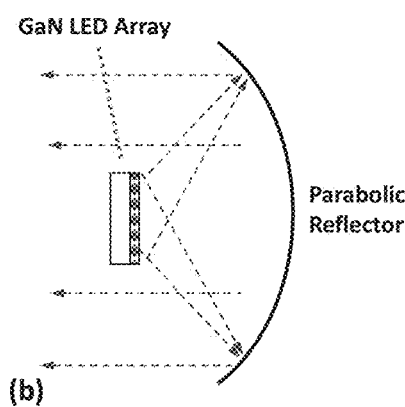

FIG. 25(b) shows the anticipated application of the 2D unipolar-doped GaN LED arrays to the sterilization of hygienic surfaces. The concept here is essentially a hand-held UV-C "pistol" with the GaN LED array located at the focal point of a garden-variety parabolic reflector much like those used in spot lights and in the headlights of automobiles. This results in a UV-C collimated beam that can be directed under human operation onto any surface or object of choice, be it the flat surfaces in a hospital surgery room, or the door knobs and handles in a building or facility subject to an "outbreak". It is remarkable that at the present time, well into the 21$^{st}$ century, many live in fear of the next flu epidemic knowing full well that it can be easily caught by opening a door or ingesting the airflow in a commons area. The disclosed UV-pistol instrument could change that predicament dramatically.

What is claimed is:

1. A solid-state device, comprising:
   a unipolar doped light emitting diode or laser diode comprising:
   a bottom n-type layer;
   a top n-type layer;
   an undoped or n-type doped middle layer inserted between the top layer and bottom layer, where the middle layer comprises at least two materials which serve as one or more heterojunction tunnel barriers;
   and where the top layer and the middle layer, the bottom layer and the middle layer, or both form an interband tunnel barrier for electrons that generate holes by interband Zener tunneling through the forbidden energy gap, and where the middle layer forms at least one intraband tunnel barrier to control the interband Zener tunneling within the active region of the light emitting diode or the laser diode.

2. The device of claim 1, wherein the top, middle and bottom layers are comprised of gallium nitride, aluminum nitride, indium nitride or alloys and combinations of III-nitride semiconductors or III-nitride compatible semiconductors.

3. The device of claim 2, wherein the interband Zener tunneling through the active region is enhanced by the polarization effects of III-nitride heterojunctions.

4. The device of claim 1, wherein the middle layer forms at least two intraband electron tunnel barriers, wherein the at least two intraband tunnel barriers form a quantum well between them, wherein the at least two intraband tunnel barriers and the quantum well are configured to act as a resonant tunneling diode.

5. The device of claim 1, wherein the middle layer forms a single intraband electron tunnel barrier.

6. The device of claim 1, wherein the middle layer is either undoped or doped less than the top and bottom n-type layers.

7. The device of claim 6, wherein the middle layer also includes an undoped spacer layer between the interband tunnel barrier and the bottom n-type layer, between the interband tunnel barrier and the top n-type layer, or both.

8. A unipolar doped light emitting diode, comprising:
   a bottom n-type layer;
   a top n-type layer;
   an undoped or n-type-doped middle layer inserted between the top layer and the bottom layer, where the middle layer comprises at least two materials which serve as heterojunction tunnel barriers;
   and where the top layer and the middle layer, or middle layer and bottom layer, or both form an interband tunnel barrier for electrons that generate holes by Zener tunneling through the forbidden energy gap, and where the middle layer forms a least one intraband tunnel barrier to control electron flow;
   and where the radiative cross-bandgap recombination of Zener-tunneling-created holes from the top or bottom layer occurs directly with electrons residing in the top or the bottom layer, respectively.

9. The light emitting diode of claim 8, wherein the top, middle and bottom layers are comprised of gallium nitride, aluminum nitride, indium nitride or alloys and combinations of III-nitride semiconductors or III-nitride compatible semiconductors.

10. The light emitting diode of claim 9, wherein the Zener tunneling is enhanced by the polarization effects at III-nitride heterojunctions.

11. The light emitting diode of claim 8, wherein the middle layer comprises at least two intraband electron tunnel barriers that form a quantum well between them, behaving as a double barrier resonant tunneling diode within the middle layer.

12. The light emitting diode of claim 8, wherein the middle layer is either undoped or doped less than the top and bottom n-type layers.

13. The light emitting diode of claim 12, wherein the middle layer also includes a spacer layer between the interband tunnel barrier and the bottom n-type layer, between the interband tunnel barrier and the top n-type layer, or both.

14. The light emitting diode of claim 13, where a region between the spacer layer and the bottom n-type layer, or between the spacer layer and the top n-type layer, comprises at least one quantum well.

15. The light emitting diode of claim 14, where the at least one quantum well is comprised of undoped or n-type doped gallium, aluminum-gallium nitride, or indium-gallium nitride alloys.

16. The light emitting diode of claim 8, where the middle layer includes an n-type delta-doped layer.

17. The light emitting diode of claim 8 where a portion of the radiatively emitted photons are converted to longer wavelengths by the addition of phosphorescent downconverting materials above the top layer, below the bottom layer, or both.

18. A unipolar doped laser diode, comprising:
   a bottom n-type layer;
   a top n-type layer;
   an undoped or n-type doped middle layer inserted between the top layer and bottom layer, where the middle layer comprises at least two materials which serve as heterojunction electron tunnel barriers;
   and wherein the top layer and the middle layer, or the bottom layer and middle layer, form an interband tunnel barrier for electrons that generate holes by Zener tunneling through the forbidden energy gap, and wherein the middle layer forms at least one intraband tunnel barrier to control electron flow;

and wherein the radiative cross-bandgap recombination of Zener-tunneling-created holes from the top or bottom layers occurs directly with electrons residing in the top or bottom layers, respectively;

and wherein a Fabry-Perot etalon is added external to the radiative recombination zone to form a laser diode.

19. The light emitting diode of claim 1 where a portion of the radiatively emitted photons are converted to longer wavelengths by the addition of phosphorescent downconverting materials above the top layer, below the bottom layer, or both.

* * * * *